(12) United States Patent
Sakuma et al.

(10) Patent No.: US 10,347,650 B1
(45) Date of Patent: Jul. 9, 2019

(54) SEMICONDUCTOR MEMORY DEVICE

(71) Applicant: TOSHIBA MEMORY CORPORATION, Minato-ku (JP)

(72) Inventors: Kiwamu Sakuma, Yokkaichi (JP); Kensuke Ota, Yokkaichi (JP); Masumi Saitoh, Yokkaichi (JP)

(73) Assignee: TOSHIBA MEMORY CORPORATION, Minato-ku (JP)

( * ) Notice: Subject to any disclaimer, the term of this patent is extended or adjusted under 35 U.S.C. 154(b) by 0 days.

(21) Appl. No.: 16/058,210

(22) Filed: Aug. 8, 2018

(30) Foreign Application Priority Data

Mar. 20, 2018 (JP) .................. 2018-052175

(51) Int. Cl.
| | |
|---|---|
| *H01L 29/76* | (2006.01) |
| *H01L 27/11573* | (2017.01) |
| *H01L 27/11582* | (2017.01) |
| *H01L 27/24* | (2006.01) |
| *H01L 29/786* | (2006.01) |
| *H01L 29/04* | (2006.01) |
| *H01L 29/423* | (2006.01) |

(52) U.S. Cl.
CPC .. *H01L 27/11573* (2013.01); *H01L 27/11582* (2013.01); *H01L 27/2436* (2013.01); *H01L 27/2481* (2013.01); *H01L 29/04* (2013.01); *H01L 29/42384* (2013.01); *H01L 29/78642* (2013.01); *H01L 29/78696* (2013.01)

(58) Field of Classification Search
None
See application file for complete search history.

(56) References Cited

U.S. PATENT DOCUMENTS

| | | | |
|---|---|---|---|
| 5,317,432 A | 5/1994 | Ino | |
| 7,936,004 B2 | 5/2011 | Kito et al. | |
| 8,735,230 B2 * | 5/2014 | Saino | H01L 21/28035 138/176 |
| 8,766,255 B2 | 7/2014 | Isobe et al. | |
| 8,779,432 B2 | 7/2014 | Yamazaki et al. | |

(Continued)

FOREIGN PATENT DOCUMENTS

| | | |
|---|---|---|
| JP | 05-297413 | 11/1993 |
| JP | 06-132218 | 5/1994 |

(Continued)

*Primary Examiner* — Hung K Vu
(74) *Attorney, Agent, or Firm* — Oblon, McClelland, Maier & Neustadt, L.L.P.

(57) ABSTRACT

A semiconductor memory device includes: a substrate; a memory cell array including memory cells arranged in a first direction intersecting a surface of the substrate; an insulating layer covering the memory cell array; and a transistor provided on the insulating layer. The transistor includes: first and second semiconductor layers provided on the insulating layer; a gate electrode provided between the first and second semiconductor layers, one end in the first direction of the gate electrode being closer to the substrate than the first and second semiconductor layers; a gate insulating film provided on the one end and on side surfaces of the gate electrode; and a third semiconductor layer facing the one end and the side surfaces of the gate electrode. The third semiconductor layer includes a crystal grain larger than a shortest distance between the insulating layer and the gate insulating film.

20 Claims, 20 Drawing Sheets

(56) References Cited

U.S. PATENT DOCUMENTS

| | | | |
|---|---|---|---|
| 9,203,023 B2 | 12/2015 | Saitoh et al. | |
| 9,548,085 B2 | 1/2017 | Saitoh | |
| 9,614,103 B2 | 4/2017 | Ota et al. | |
| 9,786,683 B1 | 10/2017 | Sakuma et al. | |
| 9,818,757 B2 | 11/2017 | Ikeda et al. | |
| 2004/0084677 A1 | 5/2004 | Tsao | |
| 2010/0213541 A1* | 8/2010 | Jeon | H01L 21/28088 257/334 |
| 2014/0367774 A1* | 12/2014 | Yoo | H01L 29/4236 257/330 |
| 2016/0268304 A1 | 9/2016 | Ikeda et al. | |

FOREIGN PATENT DOCUMENTS

| | | |
|---|---|---|
| JP | 2007-266143 | 10/2007 |
| JP | 2012-169611 | 9/2012 |
| JP | 2012-209547 | 10/2012 |
| JP | 2015-159260 | 9/2015 |
| JP | 2016-100387 | 5/2016 |
| JP | 2016-134578 | 7/2016 |
| JP | 2016-171243 | 9/2016 |
| JP | 2017-059607 | 3/2017 |
| JP | 2017-168759 | 9/2017 |

\* cited by examiner

US 10,347,650 B1

SEMICONDUCTOR MEMORY DEVICE

CROSS-REFERENCE TO RELATED APPLICATIONS

This application is based upon and claims the benefit of Japanese Patent Application No. 2018-052175, filed on Mar. 20, 2018, the entire contents of which are incorporated herein by reference.

BACKGROUND

Field

Embodiments described below relate to a semiconductor memory device.

Description of the Related Art

Development of semiconductor devices having a plurality of memory cells disposed three-dimensionally therein is proceeding along with increasingly high levels of integration of semiconductor memory devices. Among such semiconductor memory devices, there are known, for example, the likes of a so-called flash memory that utilizes as its memory cell a field effect transistor in which a charge accumulation film is included in a gate insulating film, or a so-called ReRAM that utilizes as its memory cell a resistance changing element whose resistance value is reversibly changed.

In such semiconductor memory devices, for connecting the plurality of three-dimensionally disposed memory cells to a peripheral circuit, a dead space sometimes occurs in an outer peripheral portion of a memory cell array. Accordingly, attempts are being made to form a thin film transistor (Thin Film Transistor, TFT), or the like, in such a portion, and thereby reduce area of the peripheral circuit in a substrate surface.

Embodiments below provide a semiconductor memory device having a thin film transistor of preferable characteristics.

DETAILED DESCRIPTION

Figure 1:
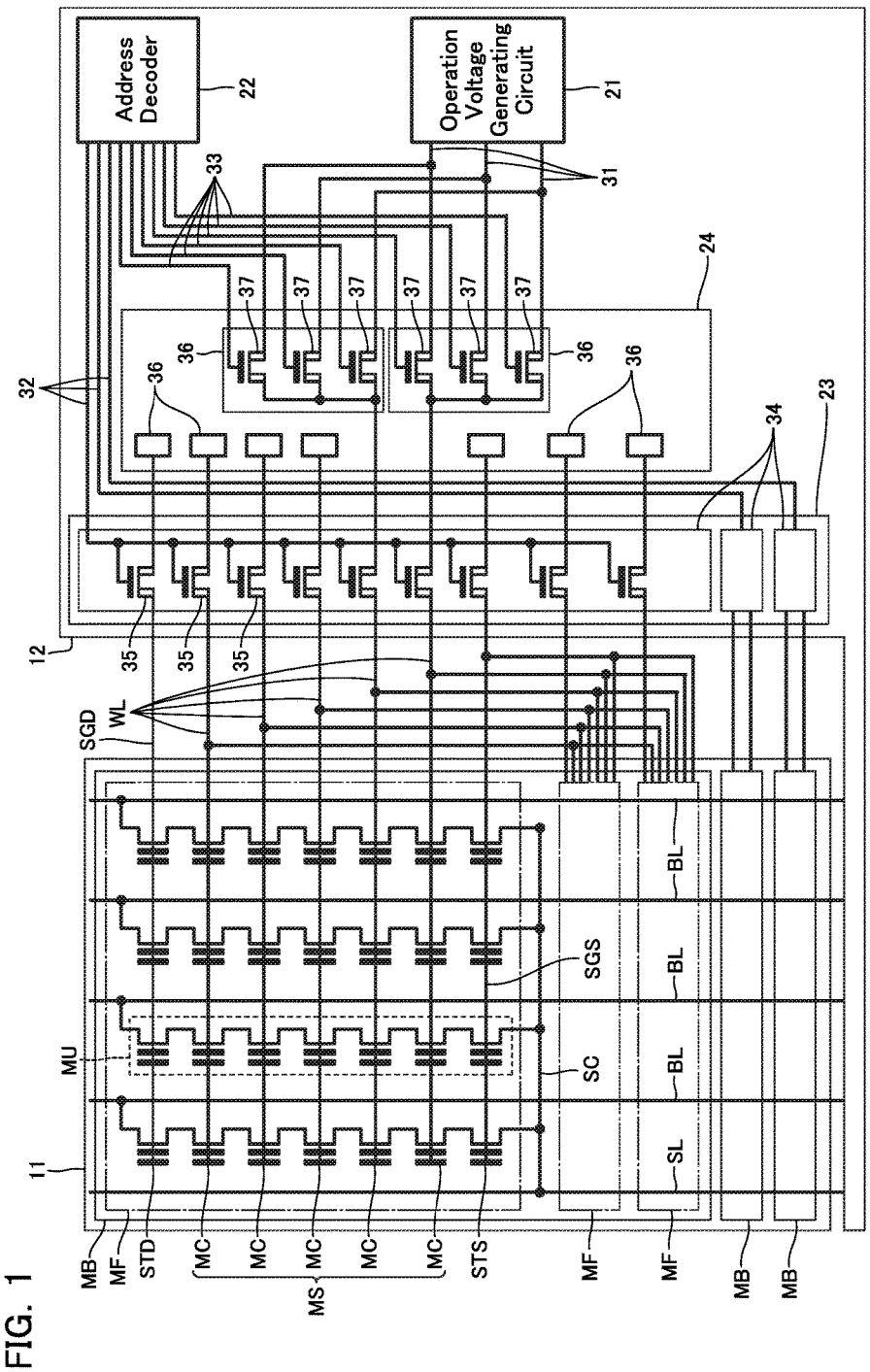
FIG. 1 is an equivalent circuit diagram showing a schematic configuration of a semiconductor memory device according to a first embodiment.

A semiconductor memory device according to one embodiment of the present invention includes: a substrate; a memory cell array having a plurality of memory cells arranged in a first direction intersecting a surface of this substrate; an insulating layer covering at least part of this memory cell array; and a transistor provided on the insulating layer. Moreover, this transistor includes: a first semiconductor layer and a second semiconductor layer provided on the insulating layer and separated from each other in a second direction intersecting the first direction; a gate electrode provided between these first semiconductor layer and second semiconductor layer in the second direction, the gate electrode extending in the first direction, and, one end in the first direction of the gate electrode being closer to the substrate than the first semiconductor layer and the second semiconductor layer; a gate insulating film provided on the one end and on side surfaces in the second direction of this gate electrode; and a third semiconductor layer facing the one end and the side surfaces in the second direction of the gate electrode via this gate insulating film, the third semiconductor layer being connected to the first semiconductor layer and the second semiconductor layer. In addition, the third semiconductor layer includes a crystal grain larger than a shortest distance between the insulating layer and the gate insulating film.

Next, semiconductor memory devices according to embodiments will be described in detail with reference to the drawings. Note that the embodiments below are merely examples, and, are not shown with the intention of limiting the present invention.

Moreover, in the present specification, a direction intersecting a surface of a substrate will be called a first direction, a direction intersecting the first direction will be called a second direction, and, a direction intersecting a plane including the first direction and the second direction will be called a third direction. In addition, an orientation of moving away from the substrate along the first direction will be called up, and, an orientation of coming closer to the substrate along the first direction will be called down. Moreover, when a lower surface or a lower end is referred to for a certain configuration, this is assumed to mean a surface or end closer to the substrate of this configuration, and, when an upper surface or an upper end is referred to for a certain configuration, this is assumed to mean a surface or end further from the substrate of this configuration. In addition, a surface intersecting the second direction and the third direction will be called a side surface. Moreover, a certain direction parallel to an upper surface of the substrate will be called an X direction, a direction parallel to the upper surface of the substrate and perpendicular to the X direction will be called a Y direction, and, a direction perpendicular to the upper surface of the substrate will be called a Z direction. Note that the description below exemplifies the case where the X direction, the Y direction, and, the Z direction respectively correspond to the third direction, the second direction, and, the first direction. However, the first direction, the second direction, and, the third direction are not limited to being the Z direction, the Y direction, and, the X direction.

In addition, when a "memory cell" is referred to in the present specification, this is assumed to mean a storage element capable of storing 1 bit or more of data, such as a field effect transistor that can store a charge in a gate insulating film, a resistance changing element whose resistance value is reversibly changed, a resistance changing element of this kind that has rectifying characteristics, or the like.

Moreover, when a "memory cell array" is referred to in the present specification, this is assumed to mean a configuration including a plurality of the memory cells, a plurality of wirings connected to the plurality of memory cells, and so on.

In addition, when a first configuration "electrically connected to" a second configuration is referred to in the present specification, the first configuration may be directly connected to the second configuration, and, the first configuration may be connected to the second configuration via one or more other configurations such as switching element such as transistors or other kinds of elements. For example, if three transistors are connected in series, first transistor is electrically connected to third transistor even if the second transistor is in an OFF state.

First Embodiment

[Configuration]

FIG. 1 is an equivalent circuit diagram showing a schematic configuration of a semiconductor memory device according to a first embodiment. For convenience of explanation, part of the configuration is omitted in FIG. 1.

The semiconductor memory device according to the present embodiment includes: a memory cell array 11; and a peripheral circuit 12 that controls the memory cell array 11.

The memory cell array 11 includes a plurality of memory blocks MB. The plurality of memory blocks MB each include a plurality of memory fingers MF. The plurality of memory fingers MF each include a plurality of memory units MU. One ends of the plurality of memory units MU are each connected to the peripheral circuit 12 via a bit line BL. Moreover, the other ends of the plurality of memory units MU are each connected to the peripheral circuit 12 via a common lower wiring SC and source line SL.

The memory unit MU includes a drain selection transistor STD, a memory string MS, and, a source selection transistor STS connected in series between the bit line BL and the lower wiring SC. Hereafter, the drain selection transistor STD and the source selection transistor STS will sometimes simply be called selection transistors (STD, STS).

The memory string MS includes a plurality of memory cells MC connected in series. The memory cell MC according to the present embodiment is a field effect type transistor including: a semiconductor layer functioning as a channel region; a gate insulating film including a charge accumulation film; and a gate electrode, and, stores 1 bit or more of data. A threshold voltage of the memory cell MC changes according to an amount of charge in the charge accumulation film. Note that each of the gate electrodes of the plurality of memory cells MC belonging to one memory string MS is connected to a word line WL. These word lines WL are connected to all of the memory units MU in one memory block MB.

Each of the selection transistors (STD, STS) is a field effect type transistor including: a semiconductor layer functioning as a channel region; a gate insulating film; and a gate electrode. Each of the gate electrodes of the selection transistors (STD, STS) is connected to a selection gate line (SGD, SGS) respectively. A drain selection line SGD is correspondingly provided to the memory finger MF and is commonly connected to all of the memory units MU in one memory finger MF. A source selection line SGS is commonly connected to all of the memory units MU in one memory block MB.

The peripheral circuit 12 includes: an operation voltage generating circuit 21 that generates an operation voltage; an address decoder 22 that decodes address data; and a block selection circuit 23 and voltage selection circuit 24 that transfer the operation voltage to the memory cell array 11 in response to an output signal of the address decoder 22.

The operation voltage generating circuit 21 includes a plurality of operation voltage output terminals 31. The operation voltage generating circuit 21 generates a plurality of kinds of operation voltages to be applied to the bit lines BL, the source line SL, the word lines WL, and, the selection gate lines (SGD, SGS) at a time of a read operation, a write operation, and, an erase operation on the memory cell array 11, and, simultaneously outputs the operation voltages from the plurality of operation voltage output terminals 31.

The address decoder 22 includes a plurality of block selection lines 32 and a plurality of voltage selection lines 33. The address decoder 22 decodes the address data to set a certain block selection line 32 and voltage selection line 33 corresponding to the address data to an H state, and, set the other block selection lines 32 and voltage selection lines 33 to an L state.

The block selection circuit 23 includes a plurality of block selection sections 34 corresponding to the memory blocks MB. Each of the plurality of block selection sections 34 includes a plurality of block selection transistors 35 corresponding to the word lines WL and the selection gate lines (SGD, SGS). The block selection transistor 35 is a field effect type high withstand voltage transistor, for example. Each of one ends of the block selection transistors 35 is connected to a corresponding word line WL or selection gate line (SGD, SGS). Each of the other ends of the block selection transistors 35 is electrically connected to the operation voltage output terminals 31 via the voltage selection circuit 24. Gate electrodes of the block selection transistors 35 are commonly connected to a corresponding block selection line 32.

The voltage selection circuit 24 includes a plurality of voltage selection sections 36 corresponding to the word lines WL and the selection gate lines (SGD, SGS). Each of the plurality of voltage selection sections 36 includes a plurality of voltage selection transistors 37. The voltage selection transistor 37 is a field effect type high withstand voltage transistor, for example. Each of one ends of the voltage selection transistors 37 is electrically connected to a corresponding word line WL or selection gate line (SGD, SGS) via the block selection circuit 23. Each of the other ends of the voltage selection transistors 37 is connected to a corresponding operation voltage output terminal 31. Each of gate electrodes of the voltage selection transistors 37 is connected to a corresponding voltage selection line 33.

Figure 2:
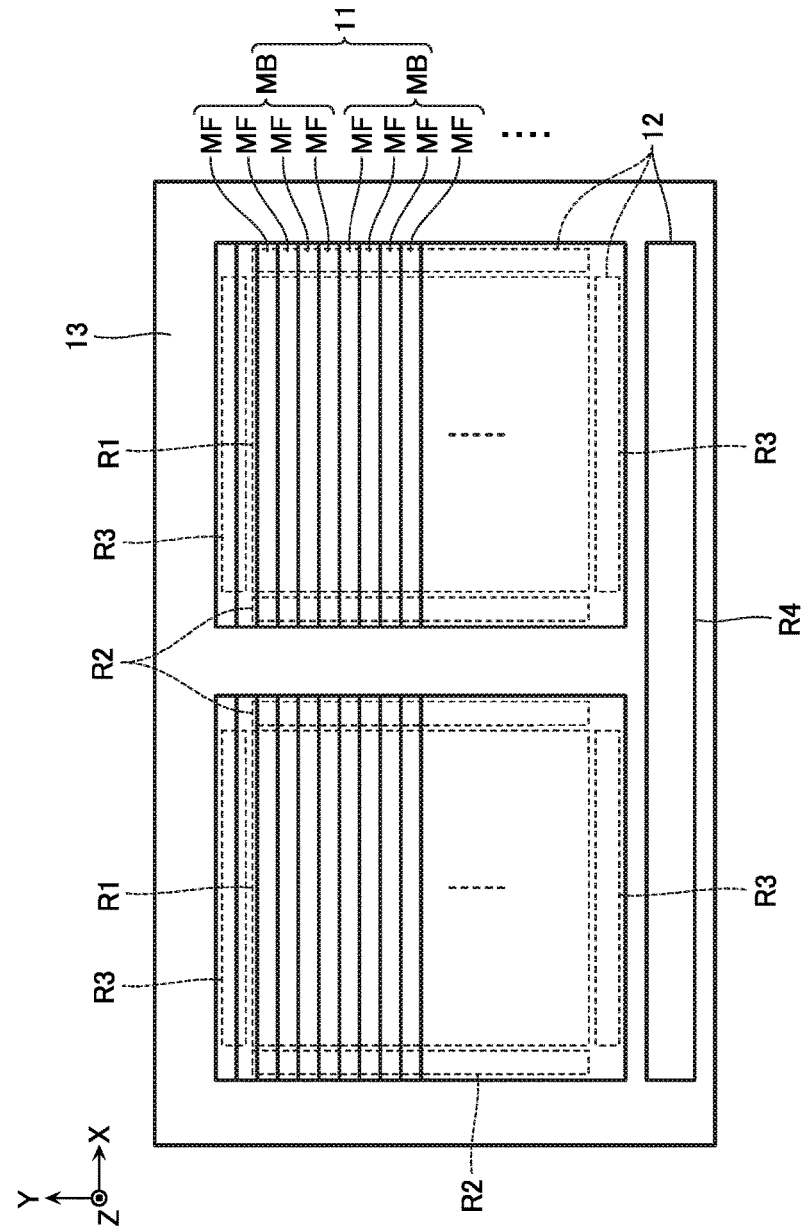
FIG. 2 is a schematic plan view of the semiconductor memory device.

FIG. 2 is a schematic plan view of the semiconductor memory device according to the present embodiment. For convenience of explanation, part of the configuration is omitted in FIG. 2.

In the present embodiment, the memory cell array 11 and the peripheral circuit 12 are provided on a substrate 13. Hereafter, regions on the substrate 13 where the memory cell array 11 and the peripheral circuit 12 are provided, will be called a first region R1 through fourth region R4.

In the illustrated example, two of the memory cell arrays 11 are disposed, separated from each other in the X direction, on the substrate 13. The memory cell array 11 includes a plurality of the memory blocks MB arranged in the Y direction. Moreover, these plurality of memory blocks MB include a plurality of the memory fingers MF arranged in the Y direction.

The first region R1 is a substantially rectangular shaped region where a central portion of the memory cell array 11 is provided. A plurality of the memory cells MC are provided in the first region R1.

The second region R2 is a region where both end sections in the X direction of the memory cell array 11 are provided, and, extends along the Y direction so as to include these end sections. End sections in the X direction of the word lines WL and contacts connected to these end sections of the word lines WL are provided in the second region R2. In addition, a plurality of transistors configuring part of the peripheral circuit 12 are provided in the second region R2.

The third region R3 is a region where both end sections in the Y direction of the memory cell array 11 are provided, and, extends along the X direction so as to include these end sections. One portion of the memory cell array 11 is provided in the third region R3. This one portion is, for example, a portion formed for convenience of a manufacturing step, and, may be a portion not functioning as a device. In addition, a plurality of transistors configuring part of the peripheral circuit 12 may be provided in the third region R3.

The fourth region R4 is a region provided outside of the memory cell array 11 (a region not overlapping the memory cell array 11 when viewed from the Z direction). A plurality of transistors configuring part of the peripheral circuit 12 are provided in the fourth region R4.

Figure 3:
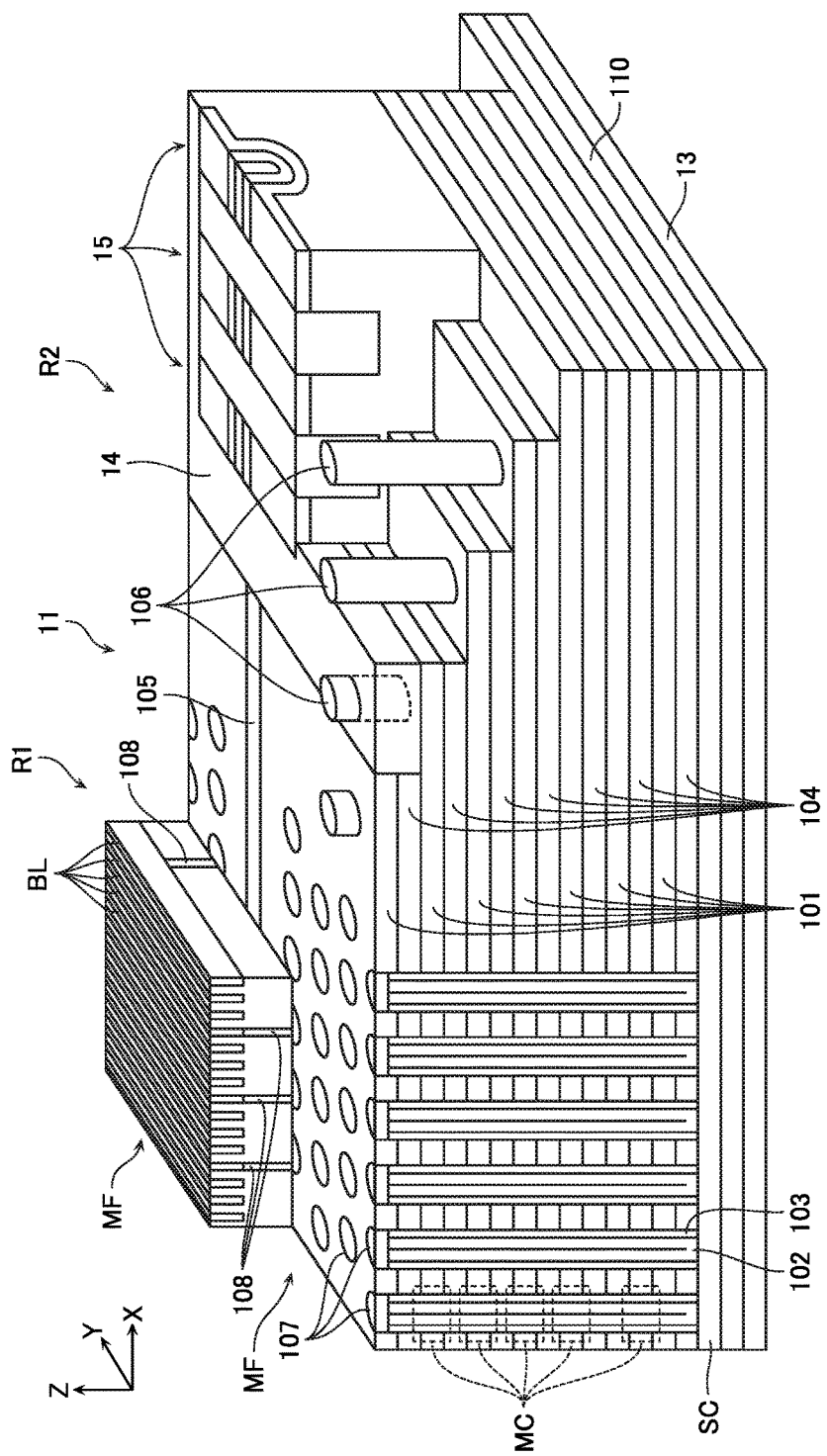
FIG. 3 is a schematic perspective view of the semiconductor memory device.

FIG. 3 is a schematic perspective view showing a configuration of the semiconductor memory device according to the present embodiment in the first region R1 and the second region R2 (FIG. 2). For convenience of explanation, part of the configuration is omitted in FIG. 3.

FIG. 3 shows: the substrate 13; the memory cell array 11 provided above the substrate 13; an insulating layer 14 covering part of the memory cell array 11; and a transistor 15 provided on the insulating layer 14.

The substrate 13 is a semiconductor substrate configured from the likes of single crystal silicon (Si), for example. The substrate 13 has, for example, a double well structure having an n type impurity layer on an upper surface of the semiconductor substrate and further having a p type impurity layer in this n type impurity layer. Note that a layer 110 provided on a surface of the substrate 13 may be an insulating layer, or, may include transistors configuring part of the peripheral circuit 12.

The memory cell array 11 includes: a plurality of conductive layers 101 arranged in the Z direction; a semiconductor layer 102 extending in the Z direction and facing the plurality of conductive layers 101; and a gate insulating film 103 provided between the plurality of conductive layers 101 and semiconductor layer 102. Note that in the illustrated example, intersecting portions of the conductive layers 101 and the semiconductor layer 102 each function as the memory cell MC.

The plurality of conductive layers 101 are plate-like conductive layers extending in the X direction, and, are configured from the likes of a laminated film of titanium nitride (TiN) and tungsten (W), for example. Each of these conductive layers 101 functions as the word line WL and as the gate electrode of the memory cells MC, or, as the selection gate line (SGD, SGS) and as the gate electrode of the selection transistors (STD, STS). Moreover, insulating layers 104 configured from the likes of silicon oxide ($SiO_2$) are provided between the plurality of conductive layers 101.

In the first region R1, the plurality of conductive layers 101 and insulating layers 104 are separated in the Y direction every memory finger MF via an insulating layer 105. Moreover, in the second region R2, end sections in the X direction of the conductive layers 101 are provided. These end sections differ from each other regarding their positions in the X direction, and, are each connected to the peripheral circuit 12 via a contact 106 extending in the Z direction. Note that in the illustrated example, the end sections in the X direction of the conductive layers 101 overall configure a stepped structure. Moreover, although illustration thereof is omitted, a similar stepped structure may be provided also in the third region R3 (FIG. 2). Hereafter, such a stepped structure will be called a stepped section.

A plurality of the semiconductor layers 102 are arranged in the X direction and the Y direction. The semiconductor layer 102 is a semiconductor layer of substantially cylindrical shape or substantially circular columnar shape extending in the Z direction, and, is configured from the likes of non-doped polycrystalline silicon (p-Si), for example. The semiconductor layer 102 functions as channel regions of the memory cells MC and the selection transistors (STD, STS). An upper end of the semiconductor layer 102 is connected to the peripheral circuit 12 via a semiconductor layer 107 implanted with an n type impurity of, for example, phosphorus (P), or the like, a contact 108, and, the bit line BL extending in the Y direction. A lower end of the semiconductor layer 102 is connected to the peripheral circuit 12 via the lower wiring SC extending in the X direction and the Y direction.

The gate insulating film 103 is configured from, for example, a tunnel insulating film, a charge accumulation film, and, a block insulating film laminated between the semiconductor layer 102 and the conductive layer 101. The tunnel insulating film and the block insulating film are configured from the likes of silicon oxide ($SiO_2$), for example. The charge accumulation film is configured from the likes of silicon nitride (SiN), for example. Note that part or all of the gate insulating film 103 may be divided every memory cell MC.

The insulating layer 14 covers at least part of the memory cell array 11. In the illustrated example, the insulating layer 14 covers the stepped section of the memory cell array 11, and, covers at least parts of the contacts 106. Now, distances in the Z direction from an upper surface of the insulating layer 14 to an upper surface of the substrate 13 are substantially identical in an XY plane. On the other hand, distances in the Z direction from a lower surface of the insulating layer 14 to the upper surface of the substrate 13 differ due to a shape of the stepped section, hence are not substantially identical in an XY plane. That is, the closer to the memory cells MC a portion of the insulating layer 14 is, the smaller a thickness in the Z direction the portion has, and, the further from the memory cells MC a portion of the insulating layer 14 is, the larger a thickness in the Z direction the portion has. Note that FIG. 3 shows a structure of the second region R2. However, as mentioned above, the stepped section may be provided also in the third region R3. The insulating layer 14 covers also this stepped section of the third region R3.

The transistor 15 is a field effect type high withstand voltage transistor configuring part of the peripheral circuit 12, and, is a thin film transistor utilizing polycrystalline silicon as a channel region. The transistor 15 may be employed as, for example, the block selection transistor 35 or voltage selection transistor 37 of FIG. 1, or another high withstand voltage transistor. In the illustrated example, a plurality of the transistors 15 are arranged in the X direction along the upper surface of the insulating layer 14. However, these transistors 15 may be arranged in the Y direction. Note that although FIG. 3 shows a structure of the second region R2, the transistor 15 may be provided also in the third region R3. The transistor 15 provided on the third region R3 may be electrically connected to the bit line BL and the operation voltage generating circuit 21 (FIG. 1), for example.

Figure 4:
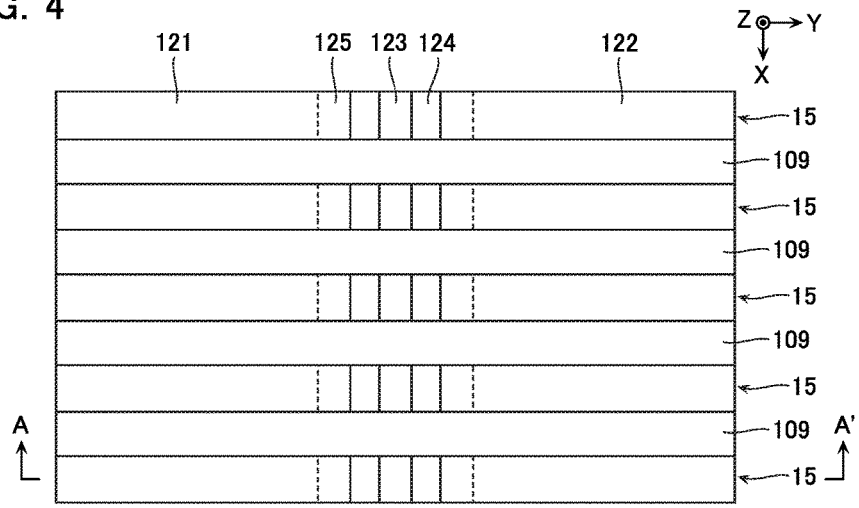
FIG. 4 is a schematic plan view showing a configuration of a transistor 15.

FIG. 4 is a schematic plan view showing a configuration of the transistor 15. A plurality of the transistors 15 are arranged in the X direction via insulating layers 109.

Figure 5:
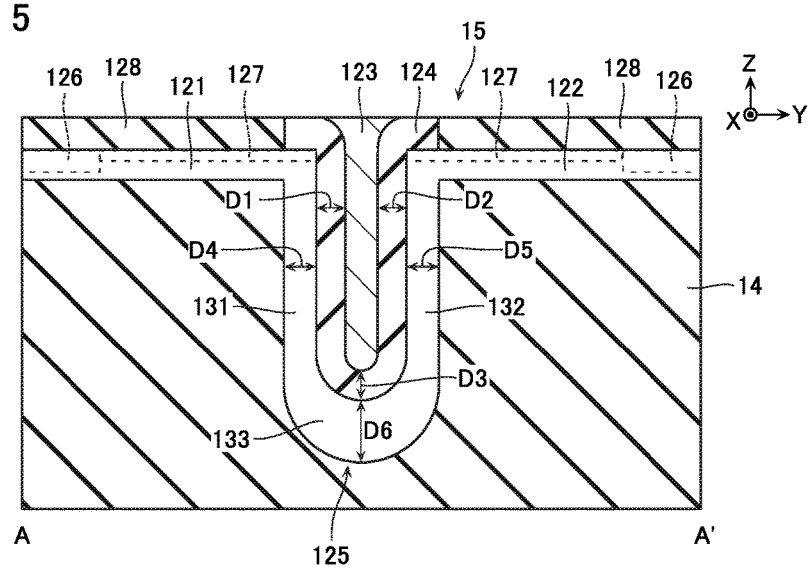
FIG. 5 is a schematic cross-sectional view showing a configuration of the transistor 15.

FIG. 5 is a schematic cross-sectional view showing a configuration of the transistor 15, and, corresponds to a cross section of a portion indicated by the line AA' of FIG. 4. The transistor 15 includes: a first semiconductor layer 121 and a second semiconductor layer 122 provided on the upper surface of the insulating layer 14 and separated from each other in the Y direction; a gate electrode 123 provided between these first semiconductor layer 121 and second semiconductor layer 122 and extending in the Z direction; a gate insulating film 124 provided on a lower end and on both side surfaces in the Y direction of the gate electrode 123; and a third semiconductor layer 125 facing the gate electrode 123 via this gate insulating film 124.

The first semiconductor layer 121 and the second semiconductor layer 122 function as a source region and a drain region of the transistor 15. The first semiconductor layer 121 may function as the source region and the second semiconductor layer 122 as the drain region, or, the first semiconductor layer 121 may function as the drain region and the second semiconductor layer 122 as the source region. The first semiconductor layer 121 and the second semiconductor layer 122 are configured from the likes of polycrystalline silicon (p-Si) that is non-doped or has been implanted with a p type impurity such as boron (B), for example. Moreover, in upper surfaces of the first semiconductor layer 121 and the second semiconductor layer 122, a high concentration impurity region 126 and a low concentration impurity region 127 where n type impurities such as phosphorus (P) have been implanted with is provided. An impurity concentration in the high concentration impurity region 126 is higher than an impurity concentration in the low concentration impurity region 127. The high concentration impurity region 126 is connected to an unillustrated contact, or the like. The low concentration impurity region 127 is provided between the high concentration impurity region 126 and a side surface in the Y direction of the gate insulating film 124. Note that an insulating layer 128 configured from the likes of silicon nitride (SiN) is provided on the upper surfaces of the first semiconductor layer 121 and the second semiconductor layer 122.

The gate electrode 123 is configured from the likes of a laminated film of titanium nitride (TiN) and tungsten (W), for example. A lower end of the gate electrode 123 is closer to the substrate 13 than the first semiconductor layer 121 and the second semiconductor layer 122. An upper end of the gate electrode 123 is further from the substrate 13 than the first semiconductor layer 121 and the second semiconductor layer 122, and, extends in the Y direction along a shape of the gate insulating film 124.

The gate insulating film 124 is configured from the likes of silicon oxide ($SiO_2$), for example. The gate insulating film 124 has substantially a U shape covering the gate electrode 123. That is, the gate insulating film 124 includes: portions provided on both side surfaces in the Y direction of the gate electrode 123; and a portion provided on the lower end of the gate electrode 123. Moreover, in the illustrated example, the gate insulating film 124 has a substantially uniform film thickness. That is, in the gate insulating film 124, lengths D1 and D2 in the Y direction of the portions provided on both side surfaces in the Y direction of the gate electrode 123 and a length D3 in the Z direction of the portion provided on the lower end of the gate electrode 123 are substantially identical. Moreover, a distance between the gate electrode 123 and the third semiconductor layer 125 is substantially uniform. The third semiconductor layer 125 is connected to the first semiconductor layer 121 and the second semiconductor layer 122, and, functions as a gate region (a channel region) of the transistor 15. The third semiconductor layer 125 is configured from the likes of polycrystalline silicon (p-Si) that is non-doped or has been implanted with a p type impurity such as boron (B), for example. Moreover, the third semiconductor layer 125 has substantially a U shape covering the gate insulating film 124. That is, the third semiconductor layer 125 includes: a first portion 131 connected to the first semiconductor layer 121; a second portion 132 connected to the second semiconductor layer 122; and a third portion 133 connected to these first portion 131 and second portion 132. The first portion 131 extends in the Z direction and is connected at its upper end section to one end section in the Y direction of the first semiconductor layer 121. The second portion 132 extends in the Z direction and is connected at its upper end section to one end section in the Y direction of the second semiconductor layer 122. The third portion 133 is closer to the substrate 13 than the first semiconductor layer 121 and the second semiconductor layer 122. Moreover, in the illustrated example, the third semiconductor layer 125 has a non-uniform film thickness. That is, a length D4 in the Y direction of the first portion 131 is substantially identical to a length D5 in the Y direction of the second portion 132. On the other hand, a length D6 in the Z direction of the third portion 133 is larger than the length D4 and the length D5. Note that the length D4 and the length D5 correspond to a shortest distance between the insulating layer 14 and the gate insulating film 124.

Figure 6:
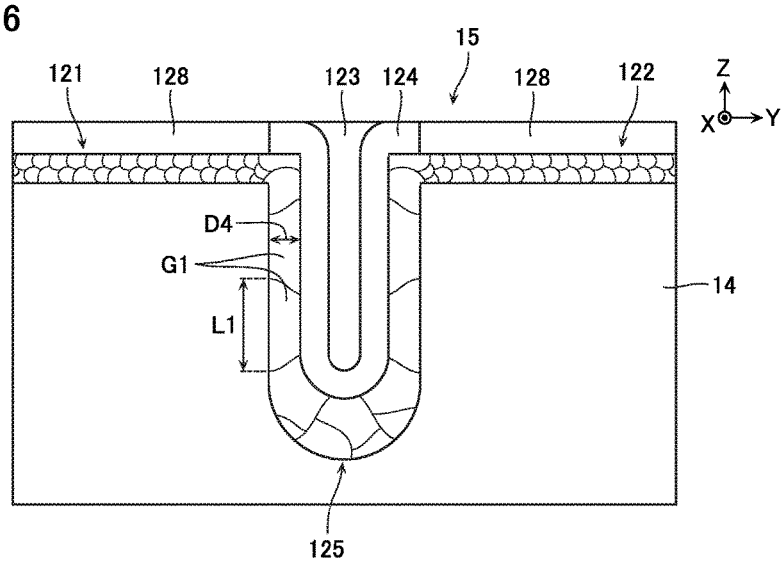
FIG. 6 is a schematic view for explaining about crystal grains in a first semiconductor layer 121, a second semiconductor layer 122, and, a third semiconductor layer 125.

FIG. 6 is a schematic view for explaining about crystal grains in the first semiconductor layer 121, the second semiconductor layer 122, and, the third semiconductor layer 125. Note that when size of a crystal grain is referred to below, this is assumed to be a maximum length obtained by measuring a length of the crystal grain from a plurality of directions in an observed cross section.

A crystal structure of the kind exemplified in FIG. 6 is observed by, for example, employing the likes of a transmission electron microscope (Transmission Electron Microscope: TEM), and, employing a method such as a nano beam electron diffraction method (Nano Beam electron Diffraction: NBD).

In the observed cross section, the third semiconductor layer 125 includes a plurality of crystal grains G1 larger than the length D4 (the shortest distance between the insulating layer 14 and the gate insulating film 124). Moreover, some of these crystal grains contact the insulating layer 14 and the gate insulating film 124. Moreover, an average value of sizes of crystal grains included in the third semiconductor layer 125 is larger than an average value of sizes of crystal grains included in the first semiconductor layer 121 and the second semiconductor layer 122. Moreover, a largest crystal grain included in the third semiconductor layer 125 is larger than a largest crystal grain included in the first semiconductor layer 121 and the second semiconductor layer 122.

[Manufacturing Method]

Next, a manufacturing method of the semiconductor memory device according to the present embodiment will be described with reference to FIGS. 7 to 19.

At a time of manufacturing of the semiconductor memory device, for example, first, the substrate 13, the plurality of conductive layers 101, the semiconductor layer 102, the gate insulating film 103, the insulating layer 14, and so on, described with reference to FIG. 3 are formed by a known method.

Figure 7:
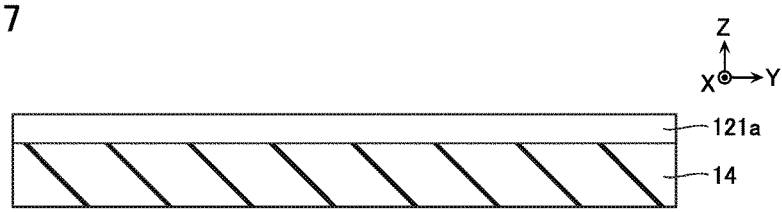
FIG. 7 is a schematic cross-sectional view showing a manufacturing method of the semiconductor memory device according to the first embodiment.

Next, as shown in FIG. 7, an amorphous silicon layer 121a is deposited on the upper surface of the insulating layer 14. Deposition is performed by, for example, a chemical vapor deposition method (CVD), or the like.

Figure 8:
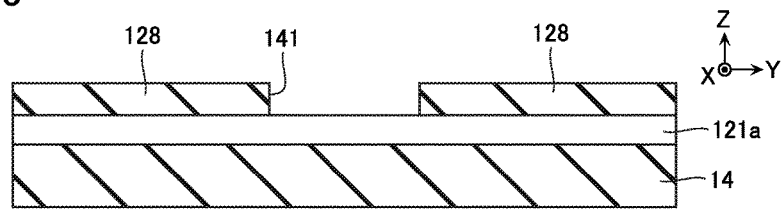
FIG. 8 is a schematic cross-sectional view showing same manufacturing method.
Figure 9:
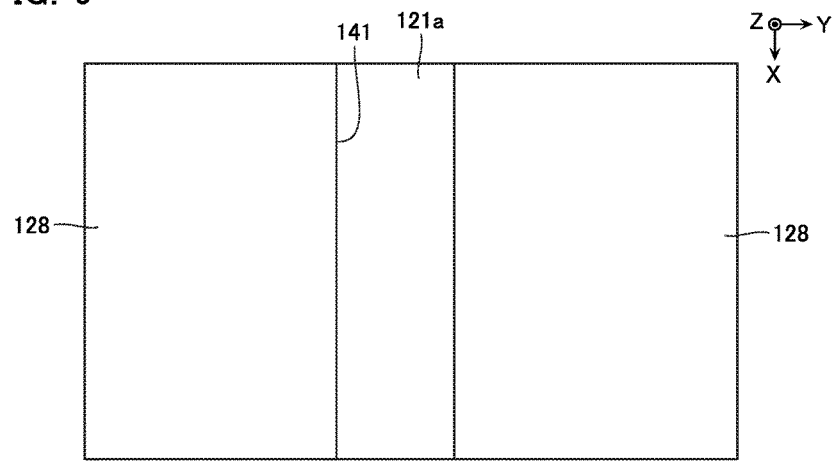
FIG. 9 is a schematic plan view showing same manufacturing method.

Next, as shown in FIGS. 8 and 9, the insulating layer 128 configured from the likes of silicon nitride (SiN) is deposited, and, a trench 141 extending in the X direction is formed. Deposition is performed by, for example, CVD, or the like. Formation of the trench 141 is performed by etching, or the like.

Figure 10:
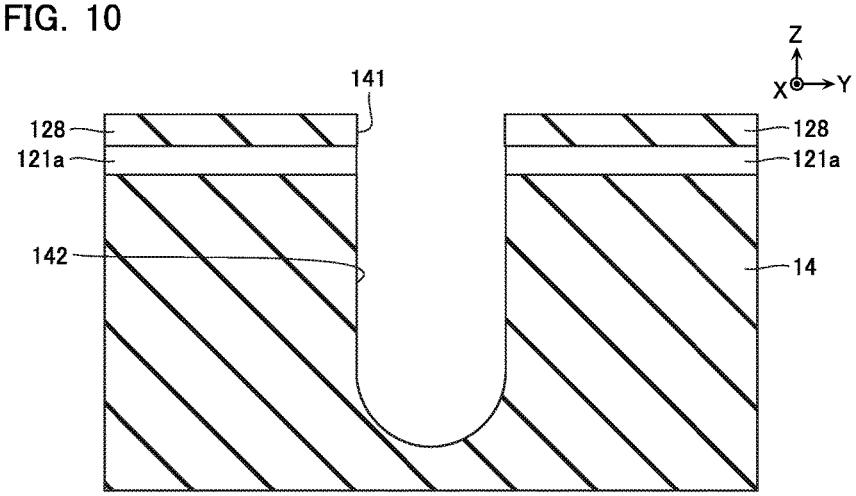
FIG. 10 is a schematic cross-sectional view showing same manufacturing method.

Next, as shown in FIG. 10, parts of the amorphous silicon layer 121a and the insulating layer 14 are removed, and, a trench 142 is formed. Formation of the trench 142 is performed by the likes of reactive ion etching (RIE) using the insulating layer 128 as a mask, for example.

Figure 11:
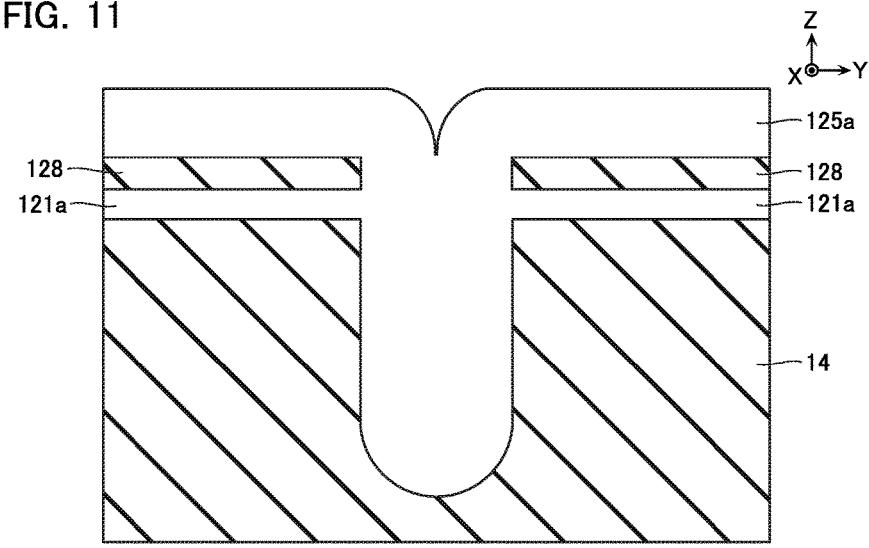
FIG. 11 is a schematic cross-sectional view showing same manufacturing method.

Next, as shown in FIG. 11, an amorphous silicon layer 125a is deposited in the trench 142, and, the trench 142 is filled in by the amorphous silicon layer 125a. Deposition is performed by, for example, CVD, or the like. Moreover, the amorphous silicon layer 125a is deposited on a bottom surface and both side surfaces in the Y direction of the trench 142. Therefore, by depositing an amorphous silicon layer 125a having a film thickness of half or more of a length in the Y direction of the trench 142, the trench 142 is filled in.

Figure 12:
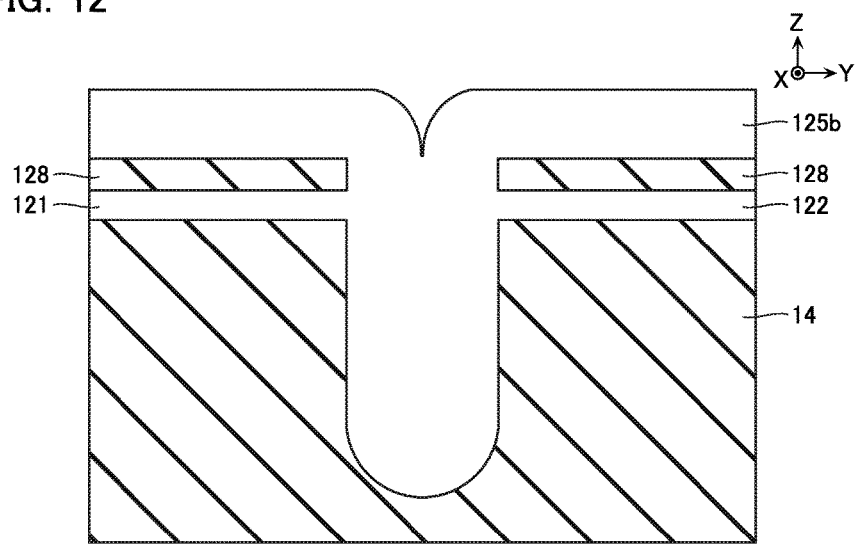
FIG. 12 is a schematic cross-sectional view showing same manufacturing method.

Next, as shown in FIG. 12, annealing processing is performed, and, a crystal structure in the amorphous silicon layer 121a and amorphous silicon layer 125a is reformed, whereby the first semiconductor layer 121, the second semiconductor layer 122, and, a polycrystalline silicon layer 125b are formed.

Figure 13:
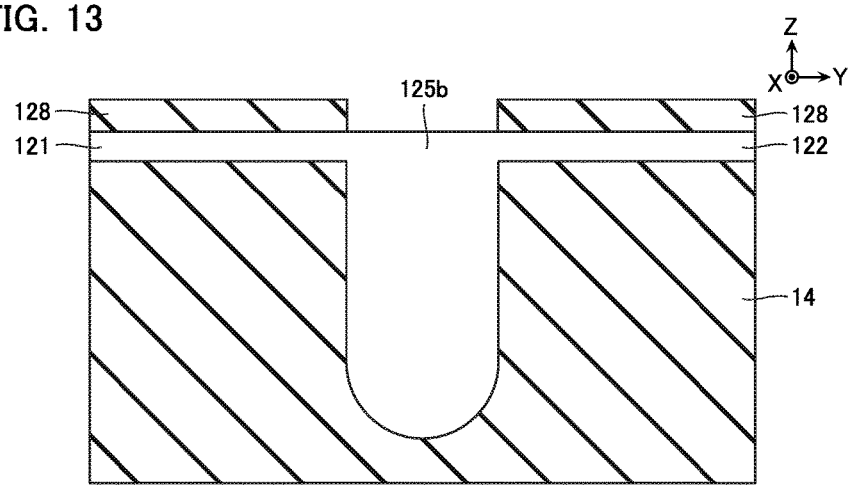
FIG. 13 is a schematic cross-sectional view showing same manufacturing method.

Next, as shown in FIG. 13, the likes of chemical mechanical polishing (CMP) using the insulating layer 128 as a stopper and RIE using the insulating layer 128 as a mask are performed, and, part of the polycrystalline silicon layer 125b is removed. An upper surface of the polycrystalline silicon layer 125b is adjusted to a position which is lower than an upper surface of the insulating layer 128 and higher than lower surfaces of the first semiconductor layer 121 and the second semiconductor layer 122.

Figure 14:
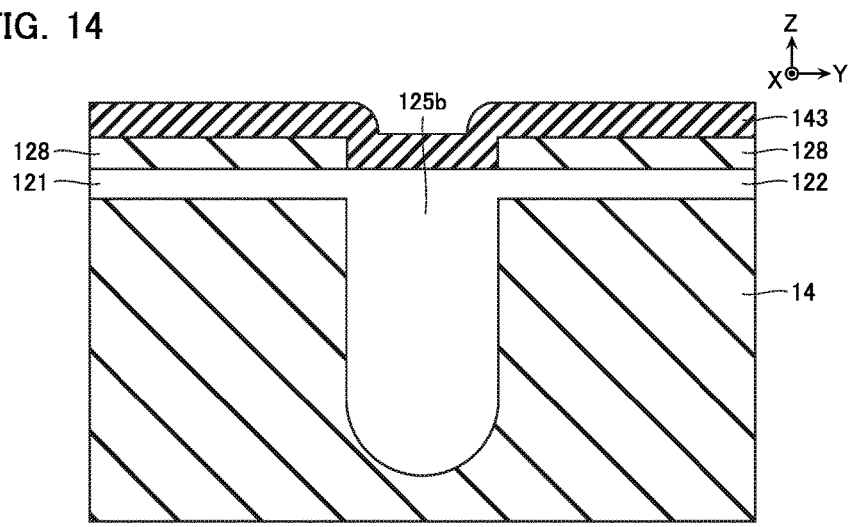
FIG. 14 is a schematic cross-sectional view showing same manufacturing method.

Next, as shown in FIG. 14, a carbon mask 143 is formed along the upper surface and a side surface in the Y direction of the insulating layer 128 and along the upper surface of the polycrystalline silicon layer 125b. Formation of the carbon mask 143 is performed by, for example, CVD, or the like.

Figure 15:
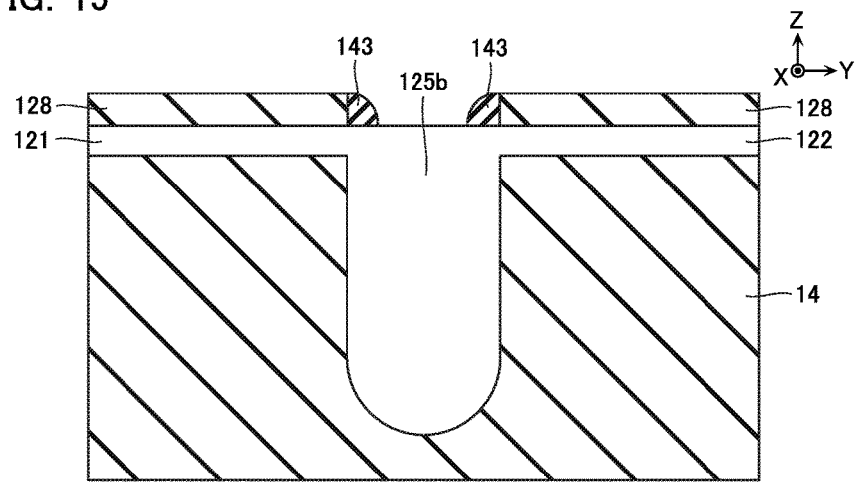
FIG. 15 is a schematic cross-sectional view showing same manufacturing method.
Figure 16:
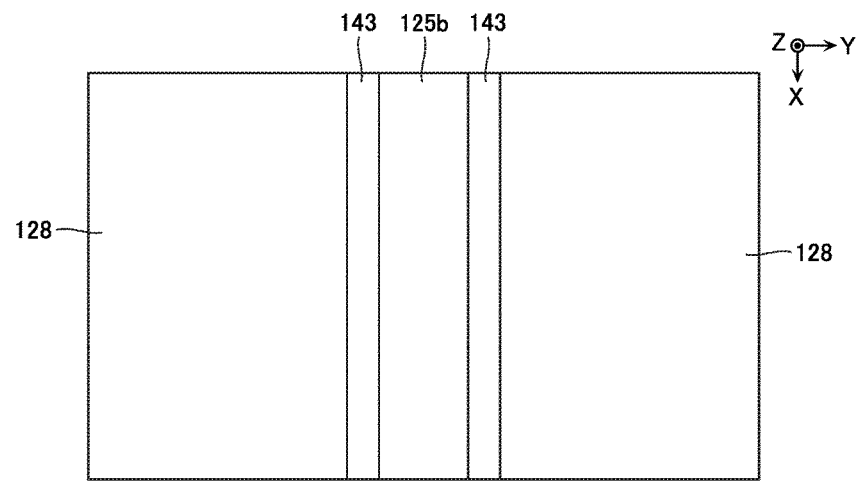
FIG. 16 is a schematic plan view showing same manufacturing method.

Next, as shown in FIG. 15, the carbon mask 143 is removed leaving a portion formed on the side surface in the Y direction of the insulating layer 128, and, the upper surface of the polycrystalline silicon layer 125b is exposed. Removal of the carbon mask 143 is performed by, for example, RIE, or the like. As shown in FIG. 16, the carbon mask 143 extends in the X direction along both side surfaces of the trench 141.

Figure 17:
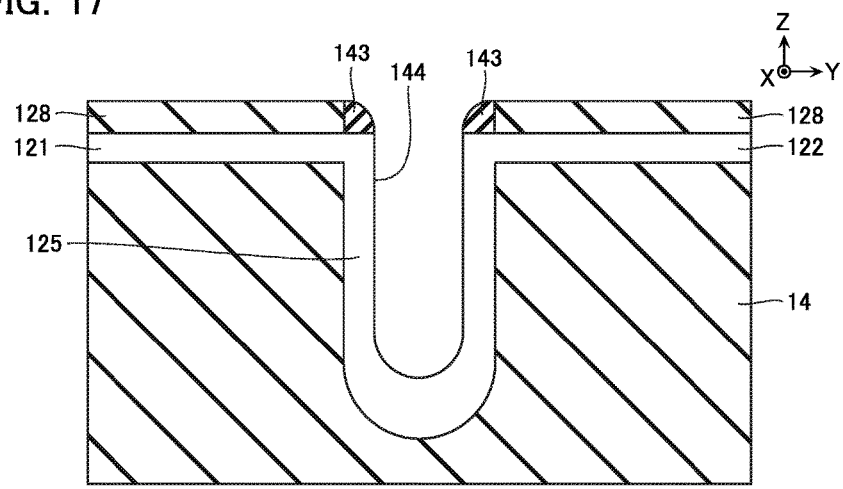
FIG. 17 is a schematic cross-sectional view showing same manufacturing method.

Next, as shown in FIG. 17, the likes of RIE using the insulating layer 128 and the carbon mask 143 as a mask is performed, and, a trench 144 is formed in the upper surface of the polycrystalline silicon layer 125b, whereby the third semiconductor layer 125 is formed.

Figure 18:
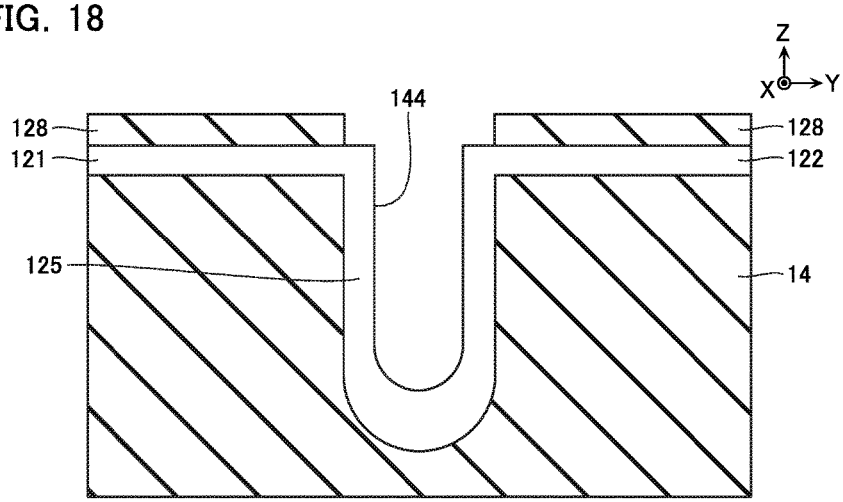
FIG. 18 is a schematic cross-sectional view showing same manufacturing method.

Next, as shown in FIG. 18, the carbon mask 143 is removed by ashing, or the like.

Figure 19:
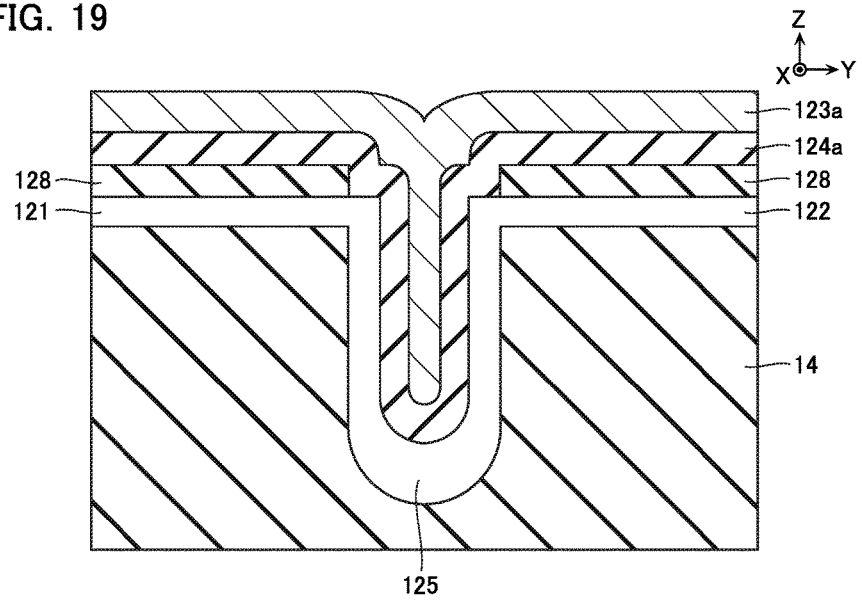
FIG. 19 is a schematic cross-sectional view showing same manufacturing method.

Next, as shown in FIG. 19, an insulating film 124a and a conductive film 123a are deposited on an inside of the trench 144. Deposition is performed by, for example, CVD, or the like.

Next, the likes of CMP using the insulating layer 128 as a stopper is performed, and, the high concentration impurity region 126 and low concentration impurity region 127 are formed by the likes of ion implantation, whereby a structure shown in FIG. 5 is formed. Moreover, this structure is divided in the X direction by the likes of RIE to form the insulating layer 109, whereby a structure shown in FIG. 4 is formed. Then, various kinds of wirings or contacts, and so on, are formed, whereby a structure described with reference to FIG. 3 is formed.

[Advantages]

As mentioned above, in recent years, there has been a desire to improve characteristics of thin film transistors. For example, it is desirable that a current flowing between source and drain when the transistor is in an ON state (hereafter, called an "ON current") is large. Moreover, it is desirable that a current flowing between source and drain when the transistor is in an OFF state (hereafter, called an "OFF leak current") is small.

Now, if such characteristics are taken into consideration, it is desirable that crystal grains in the third semiconductor layer 125 are large. For example, when the transistor is in the ON state, a resistance value at a crystal grain boundary is larger than a resistance value in the crystal grain. Therefore, the fewer the crystal grain boundaries are, that is, the larger the crystal grains are, the larger the ON current can be made. On the other hand, when the transistor is in the OFF state, the resistance value at the crystal grain boundary is smaller than the resistance value in the crystal grain. Therefore, the fewer the crystal grain boundaries are, that is, the larger the crystal grains are, the smaller the OFF leak current can be made.

Now, as a result of investigations by the inventors, it was understood that when an amorphous silicon layer undergoes annealing processing to form a polycrystalline silicon layer, the larger a film thickness of the amorphous silicon layer is, the larger the crystal grains in the polycrystalline silicon layer will become.

Accordingly, in the present embodiment, the trench 142 is formed in the insulating layer 14 (FIG. 10), this trench 142 is filled in by the amorphous silicon layer 125a (FIG. 11), and, annealing processing is performed in this state, whereby the polycrystalline silicon layer 125b is formed (FIG. 12).

In such a method, the film thickness of the amorphous silicon layer 125a when annealing processing is performed will be larger than the film thickness (for example, the lengths D4, D5 in FIG. 5) of the third semiconductor layer 125 in a completed product. Therefore, the crystal grains in the third semiconductor layer 125 can be made larger, compared to a case that, for example, the amorphous silicon layer, the gate insulating film and the gate electrode are deposited directly in the trench 142, and, annealing processing is performed in this directly deposited state. This makes it possible to provide a thin film transistor of good characteristics achieving the crystal structure like that described with reference to FIG. 6.

In particular, in the crystal structure like that described with reference to FIG. 6, the third semiconductor layer 125 includes the crystal grains G1 contacting the insulating layer 14 and the gate insulating film 124. As a result, a path of a leak current is severed, and, the OFF leak current is effectively suppressed.

Moreover, in the present embodiment, the amorphous silicon layer 125a is deposited from both side surfaces in the Y direction of the trench 142. Therefore, the film thickness of the amorphous silicon layer 125a required to fill in the trench 142 is about half of the length in the Y direction of the trench 142. Therefore, deposition can be performed in about half the time, compared to a case that, for example, an amorphous silicon layer of the same film thickness is deposited on a plane surface.

Moreover, in the present embodiment, the transistors 15 are provided in the second region R2 or the third region R3. As mentioned above, the second region R2 and the third region R3 are provided with the stepped section of the memory cell array 11 (refer to FIG. 3). Therefore, the insulating layer 14 covering this stepped section includes a portion of large thickness in the Z direction. Now, the transistor 15 has a structure in which the gate electrode 123, the gate insulating film 124 and the third semiconductor layer 125 extend in the Z direction, and, while a length in the Z direction of the transistor 15 is larger than that of an ordinary planar type field effect transistor, its length in the Y direction (X direction) is smaller. Therefore, the portion of large thickness in the Z direction of the insulating layer 14 can be effectively utilized to provide the transistors 15 in high density on the upper surface of the insulating layer 14.

Second Embodiment

Figure 20:
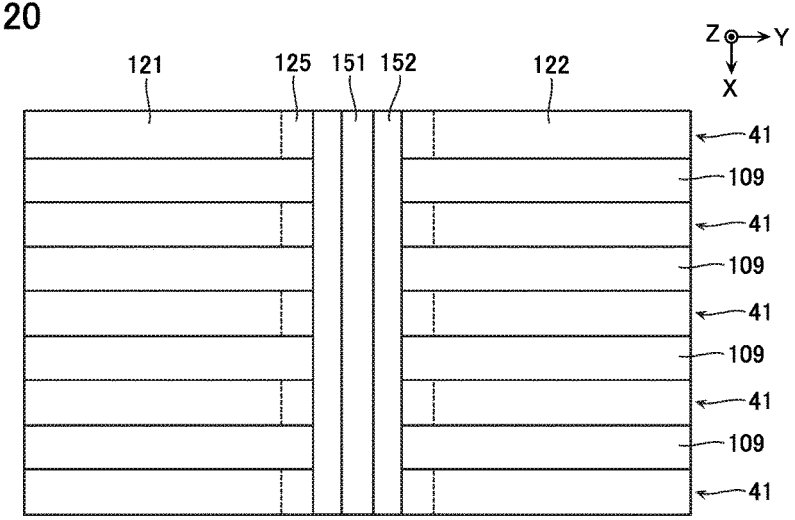
FIG. 20 is a schematic plan view showing a schematic configuration of a semiconductor memory device according to a second embodiment.

Next, a semiconductor memory device according to a second embodiment will be described with reference to FIG. 20. Note that in the description below, portions similar to in the first embodiment will be assigned with identical symbols to those assigned in the first embodiment, and, descriptions thereof will be omitted.

Although the semiconductor memory device according to the present embodiment is basically configured similarly to that of the first embodiment, a configuration of a transistor 41 differs. Although the transistor 41 is basically configured similarly to the transistor 15 according to the first embodiment, configurations of a gate electrode 151 and a gate insulating film 152 differ. Although the gate electrode 151 and the gate insulating film 152 are basically configured similarly to the gate electrode 123 and the gate insulating film 124 according to the first embodiment, the gate electrode 151 and the gate insulating film 152 extend in the X direction and are shared between a plurality of the transistors 41.

Such a configuration enables connection to the gate electrode 151 of a plurality of the transistors 41 by one contact only, and, makes it possible for the number of contacts or wirings, and so on, to be reduced.

Third Embodiment

Figure 21:
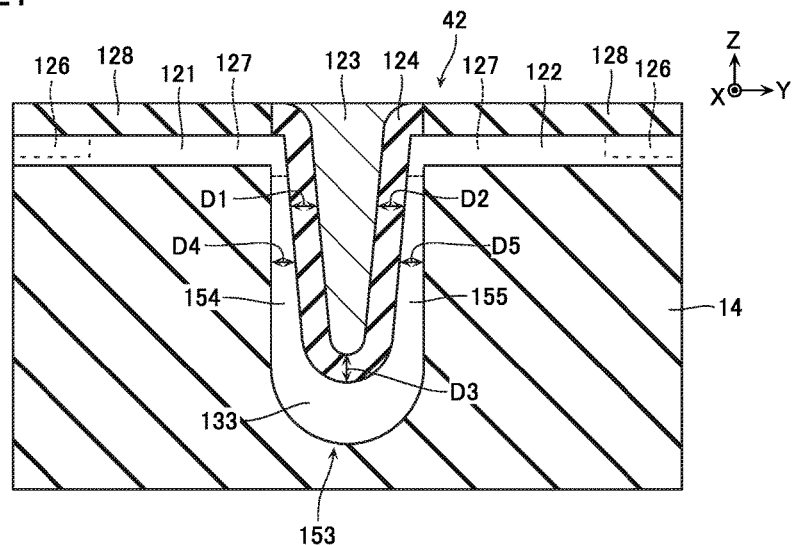
FIG. 21 is a schematic cross-sectional view showing a schematic configuration of a semiconductor memory device according to a third embodiment.

Next, a semiconductor memory device according to a third embodiment will be described with reference to FIG. 21. Note that in the description below, portions similar to in the first embodiment will be assigned with identical symbols to those assigned in the first embodiment, and, descriptions thereof will be omitted.

Although the semiconductor memory device according to the present embodiment is basically configured similarly to that of the first embodiment, a configuration of a transistor 42 differs. Although the transistor 42 is basically configured similarly to the transistor 15 according to the first embodiment, a configuration of a third semiconductor layer 153 differs. Although the third semiconductor layer 153 is basically configured similarly to the third semiconductor layer 125 according to the first embodiment, the closer to the substrate 13 portions of a first portion 154 and a second portion 155 of the third semiconductor layer 153 are, the larger the lengths D4 and D5 in the Y direction the portions have, and, the further from the substrate 13 portions of the first portion 154 and the second portion 155 of the third semiconductor layer 153 are, the smaller the lengths D4 and D5 in the Y direction the portions have. Note that a difference between a maximum value and a minimum value in the lengths D4 and D5 is at least larger than a difference between a maximum value and a minimum value in the lengths D1, D2, D3 of the gate insulating film 124.

As mentioned above, sometimes, at a time of manufacturing of the transistor 15, an impurity is implanted in the first semiconductor layer 121, the second semiconductor layer 122, and, the third semiconductor layer 125, whereby the high concentration impurity region 126 and the low concentration impurity region 127 are formed. Now, sometimes, the implanted impurity reaches a deep portion of the third semiconductor layer 125, and, the OFF leak current of the transistor 42 increases. Accordingly, in the present embodiment, the lengths D4 and D5 are adjusted as mentioned above. As a result, dispersion of the impurity in the third semiconductor layer 153 can be suppressed.

Fourth Embodiment

Figure 22:
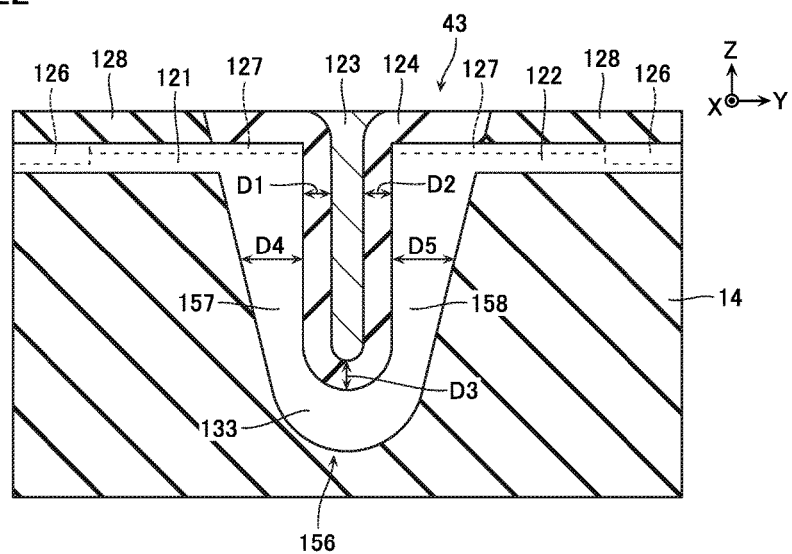
FIG. 22 is a schematic cross-sectional view showing a schematic configuration of a semiconductor memory device according to a fourth embodiment.

Next, a semiconductor memory device according to a fourth embodiment will be described with reference to FIG. 22. Note that in the description below, portions similar to in the first embodiment will be assigned with identical symbols to those assigned in the first embodiment, and, descriptions thereof will be omitted.

Although the semiconductor memory device according to the present embodiment is basically configured similarly to that of the first embodiment, a configuration of a transistor 43 differs. Although the transistor 43 is basically configured similarly to the transistor 15 according to the first embodiment, a configuration of a third semiconductor layer 156 differs. Although the third semiconductor layer 156 is basically configured similarly to the third semiconductor layer 125 according to the first embodiment, the closer to the substrate 13 portions of a first portion 157 and a second portion 158 of the third semiconductor layer 156 are, the smaller the lengths D4 and D5 in the Y direction the portions have, and, the further from the substrate 13 portions of the first portion 157 and the second portion 158 of the third semiconductor layer 156 are, the larger the lengths D4 and D5 in the Y direction the portions have. Note that a difference between a maximum value and a minimum value in the lengths D4 and D5 is at least larger than a difference between a maximum value and a minimum value in the lengths D1, D2, D3 of the gate insulating film 124.

In such a configuration, a length of a vicinity of an upper end of the third semiconductor layer 156 is broadened, whereby the ON current can be increased. Note that in the present embodiment, suppression of the OFF leak current is mainly performed at a vicinity of a lower end the third semiconductor layer 156.

Fifth Embodiment

Figure 23:
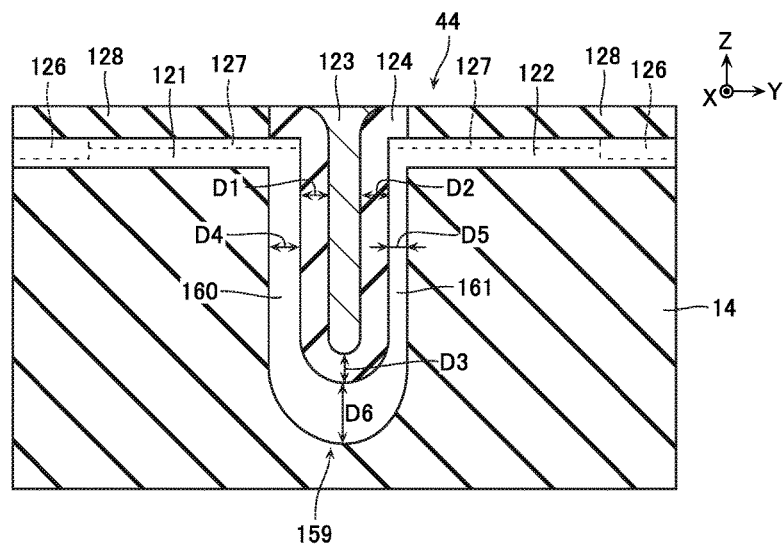
FIG. 23 is a schematic cross-sectional view showing a schematic configuration of a semiconductor memory device according to a fifth embodiment.

Next, a semiconductor memory device according to a fifth embodiment will be described with reference to FIG. 23. Note that in the description below, portions similar to in the first embodiment will be assigned with identical symbols to those assigned in the first embodiment, and, descriptions thereof will be omitted.

Although the semiconductor memory device according to the present embodiment is basically configured similarly to that of the first embodiment, a configuration of a transistor 44 differs. Although the transistor 44 is basically configured similarly to the transistor 15 according to the first embodiment, a configuration of a third semiconductor layer 159 differs. Although the third semiconductor layer 159 is basically configured similarly to the third semiconductor layer 125 according to the first embodiment, the length D4 in the Y direction of a first portion 160 of the third semiconductor layer 159 is larger than a length D5 in the Y direction of a second portion 161 of the third semiconductor layer 159. Note that a difference of the lengths D4 and D5 is at least larger than a difference between a maximum value and a minimum value in the lengths D1, D2, D3 of the gate insulating film 124. Note that in the present embodiment, a contact on a source side is connected to the high concentration impurity region 126 of the first semiconductor layer 121, and, a contact on a drain side is connected to the high concentration impurity region 126 of the second semiconductor layer 122.

In such a configuration, the ON current can be increased, similarly to in the configuration according to the fourth embodiment. Moreover, the OFF leak current can be suppressed more effectively, compared to in the fourth embodiment.

Sixth Embodiment

Figure 24:
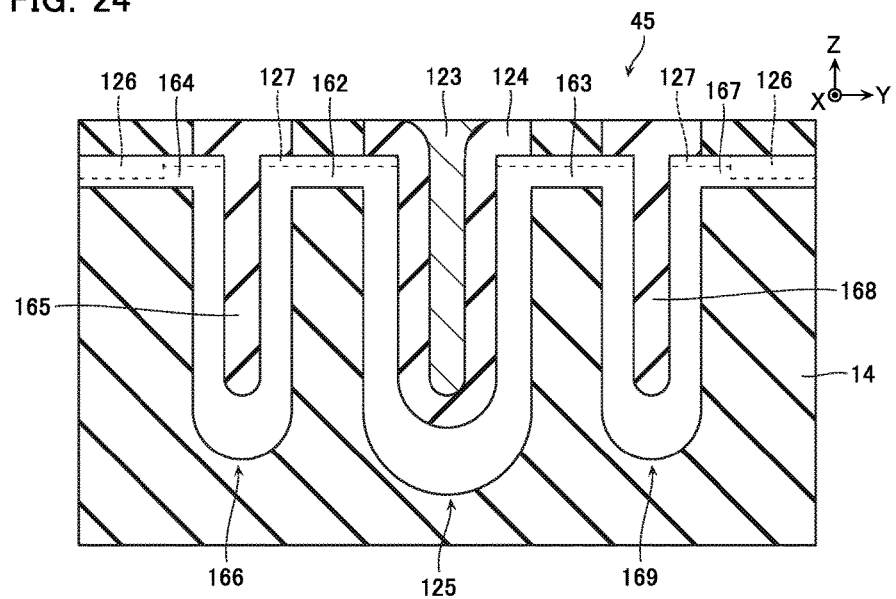
FIG. 24 is a schematic cross-sectional view showing a schematic configuration of a semiconductor memory device according to a sixth embodiment.

Next, a semiconductor memory device according to a sixth embodiment will be described with reference to FIG. 24. Note that in the description below, portions similar to in the first embodiment will be assigned with identical symbols to those assigned in the first embodiment, and, descriptions thereof will be omitted.

Although the semiconductor memory device according to the present embodiment is basically configured similarly to that of the first embodiment, a configuration of a transistor 45 differs. Although the transistor 45 is basically configured similarly to the transistor 15 according to the first embodiment, it includes a semiconductor layer extending in the Z direction not only in the gate region (a channel region), but also in the source region and the drain region.

That is, the gate region of the transistor 45 is provided with: a first semiconductor layer 162 and a second semiconductor layer 163 provided on the insulating layer 14 and separated from each other in the Y direction; the gate electrode 123 provided between the first semiconductor layer 162 and the second semiconductor layer 163; the gate insulating film 124 provided on a lower end and on both side surfaces of the gate electrode 123; and the third semiconductor layer 125 facing the gate electrode 123 via this gate insulating film 124. Although the first semiconductor layer 162 and the second semiconductor layer 163 are basically similar to the first semiconductor layer 121 and the second semiconductor layer 122 according to the first embodiment, the first semiconductor layer 162 and the second semiconductor layer 163 are not provided with the high concentration impurity region 126.

Moreover, the source region of the transistor 45 is provided with: a fourth semiconductor layer 164 provided on the insulating layer 14 and separated in the Y direction from the first semiconductor layer 162; an insulating film 165 provided between the first semiconductor layer 162 and the fourth semiconductor layer 164 and extending in the Z direction; and a fifth semiconductor layer 166 provided on a lower end and on both side surfaces in the Y direction of the insulating film 165. Although the fourth semiconductor layer 164 is basically similar to the first semiconductor layer 162, it is provided with the high concentration impurity region 126. The insulating film 165 is configured from a similar material to the gate insulating film 124. The fifth semiconductor layer 166 is connected to the first semiconductor layer 162 and the fourth semiconductor layer 164. The fifth semiconductor layer 166 has a crystal structure similar to that of the third semiconductor layer 125, for example, and, includes a crystal grain larger than a shortest distance between the insulating layer 14 and the insulating film 165.

Moreover, the drain region of the transistor 45 is provided with: a sixth semiconductor layer 167 provided on the insulating layer 14 and separated in the Y direction from the second semiconductor layer 163; an insulating film 168 provided between the second semiconductor layer 163 and the sixth semiconductor layer 167 and extending in the Z direction; and a seventh semiconductor layer 169 provided on a lower end and on both side surfaces in the Y direction of the insulating film 168. Although the sixth semiconductor layer 167 is basically similar to the second semiconductor layer 163, it is provided with the high concentration impurity region 126. The insulating film 168 is configured from a similar material to the gate insulating film 124. The seventh semiconductor layer 169 is connected to the second semiconductor layer 163 and the sixth semiconductor layer 167. The seventh semiconductor layer 169 has a crystal structure similar to that of the third semiconductor layer 125, for example, and, includes a crystal grain larger than a shortest distance between the insulating layer 14 and the insulating film 168.

In such a configuration, a length in the Y direction (X direction) of the transistor 45 is even more reduced than that of the transistor 15 according to the first embodiment, and, the transistors 45 can be provided in even higher density on the upper surface of the insulating layer 14.

Seventh Embodiment

Figure 25:
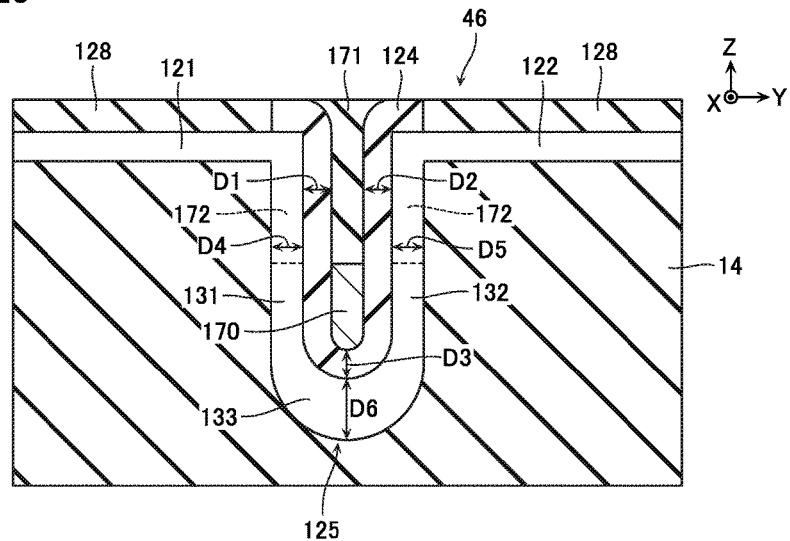
FIG. 25 is a schematic cross-sectional view showing a schematic configuration of a semiconductor memory device according to a seventh embodiment.

Next, a semiconductor memory device according to a seventh embodiment will be described with reference to FIG. 25. Note that in the description below, portions similar to in the first embodiment will be assigned with identical symbols to those assigned in the first embodiment, and, descriptions thereof will be omitted.

Although the semiconductor memory device according to the present embodiment is basically configured similarly to that of the first embodiment, a configuration of a transistor 46 differs. Although the transistor 46 is basically configured similarly to the transistor 15 according to the first embodiment, configurations of a gate electrode 170 and an impurity diffusion region 172 differ.

Although the gate electrode 170 is basically configured similarly to the gate electrode 123 according to the first embodiment, an upper end of the gate electrode 170 is closer to the substrate 13 than the first semiconductor layer 121 and the second semiconductor layer 122. Moreover, an insulating layer 171 configured from the likes of silicon oxide (SiO$_2$) is provided on the upper end of the gate electrode 170.

The impurity diffusion region 172 is an impurity diffusion region implanted with an n type impurity such as phosphorus (P). The impurity diffusion region 172 is provided in the first semiconductor layer 121, the second semiconductor layer 122, and, the third semiconductor layer 125. The further from the substrate 13 a portion of the impurity diffusion region 172 is, the higher an impurity concentration in the portion is, and, the closer to the substrate 13 a portion of the impurity diffusion region 172 is, the lower an impurity concentration in the portion is. Note that a lower end of the impurity diffusion region 172 may be provided at the same level of height position as the upper end of the gate electrode 170, for example. Moreover, the impurity diffusion region 172 is connected to an unillustrated contact, or the like.

In such a configuration, a concentration gradient of the impurity in the impurity diffusion region 172 becomes gentle, hence stress due to a voltage is dispersed, and, it becomes possible to provide a transistor 46 of high withstand voltage.

Note that although the length D4 in the Y direction of the first portion 131 of the third semiconductor layer 125 is substantially identical to the length D5 in the Y direction of the second portion 132 of the third semiconductor layer 125 in the illustrated example, the length D4 may differ from the length D5. Moreover, although the length D6 in the Z direction of the third portion 133 is larger than the length D4 and the length D5 in the illustrated example, the length D6 may be substantially the same as the length D4 and the length D5, or, may be smaller than the length D4 and the length D5. Moreover, although the length D4 and the length D5 are substantially uniform in the illustrated example, it is possible that the closer to the substrate 13 a portion of the first portion 131 and the second portion 132 is, the larger the length D4 and the length D5 of the portion is, or, it is possible that the closer to the substrate 13 a portion of the first portion 131 and the second portion 132 is, the smaller the length D4 and the length D5 of the portion is.

Eighth Embodiment

Figure 26:
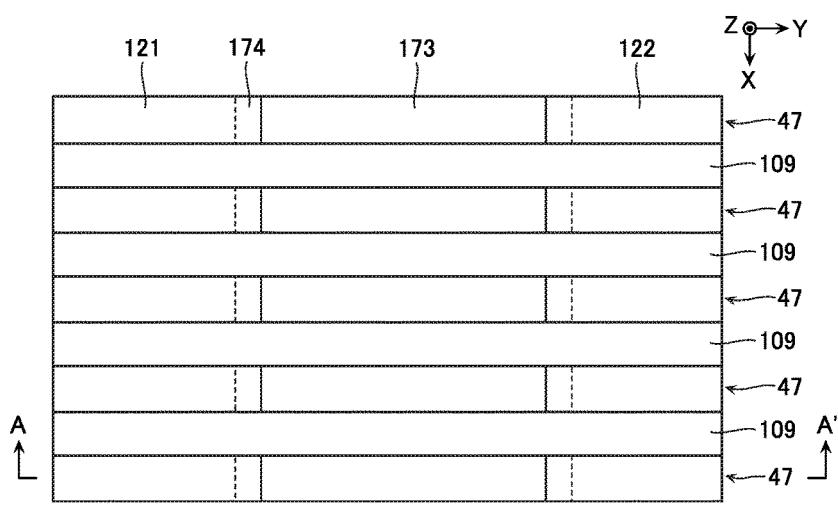
FIG. 26 is a schematic plan view showing a schematic configuration of a semiconductor memory device according to an eighth embodiment.

Next, a semiconductor memory device according to an eighth embodiment will be described with reference to FIGS. 26 and 27. Note that in the description below, portions similar to in the first embodiment will be assigned with identical symbols to those assigned in the first embodiment, and, descriptions thereof will be omitted.

Although the semiconductor memory device according to the present embodiment is basically configured similarly to that of the first embodiment, a configuration of a transistor 47 differs. The transistor 47 includes: the first semiconductor layer 121 and the second semiconductor layer 122 provided on the upper surface of the insulating layer 14 and separated from each other in the Y direction; an insulating layer 173 provided between these first semiconductor layer 121 and second semiconductor layer 122; a third semiconductor layer 174 provided on a lower surface (on a lower end) and on both side surfaces in the Y direction of this insulating layer 173; a gate electrode 176 provided between this third semiconductor layer 174 and the substrate 13; and a gate insulating film 175 provided between the third semiconductor layer 174 and the gate electrode 176.

The insulating layer 173 is configured from the likes of silicon oxide (SiO$_2$), for example. The insulating layer 173 has a substantially rectangular shape. A lower end of the insulating layer 173 is closer to the substrate 13 than the first semiconductor layer 121 and the second semiconductor layer 122. An upper end of the insulating layer 173 is further from the substrate 13 than the first semiconductor layer 121 and the second semiconductor layer 122. The upper end of the insulating layer 173 in the illustrated example forms a continuous plane surface with the upper surface of the insulating layer 128.

The third semiconductor layer 174 is connected to the first semiconductor layer 121 and the second semiconductor layer 122, and, functions as a gate region (channel region) of the transistor 47. The third semiconductor layer 174 is configured from the likes of polycrystalline silicon (p-Si) that is non-doped or has been implanted with a p type impurity such as boron (B), for example.

Moreover, the third semiconductor layer 174 has substantially a U shape covering the insulating layer 173. That is, the third semiconductor layer 174 includes: a first portion 178 connected to the first semiconductor layer 121; a second portion 179 connected to the second semiconductor layer 122; and a third portion 180 connected to these first portion 178 and second portion 179. The first portion 178 extends in the Z direction and is connected at its upper end section to one end section in the Y direction of the first semiconductor layer 121. The second portion 179 extends in the Z direction and is connected at its upper end section to one end section in the Y direction of the second semiconductor layer 122. The third portion 180 is closer to the substrate 13 than the first semiconductor layer 121 and the second semiconductor layer 122. Moreover, in the illustrated example, the third semiconductor layer 174 has a non-uniform film thickness. That is, a length D4 in the Y direction of the first portion 178 is substantially identical to a length D5 in the Y direction of the second portion 179. On the other hand, a length D6 in the Z direction of the third portion 180 is larger than the length D4 and the length D5. Note that the length D6 corresponds to a shortest distance between the insulating layer 173 and the gate insulating film 175. Moreover, the length D4 may differ from the length D5. Moreover, the length D6 may be substantially the same as the length D4 and the length D5, or, may be smaller than the length D4 and the length D5. Moreover, it is possible that the closer to the substrate 13 a portion of the first portion 178 and the second portion 179 is, the larger the length D4 and the length D5 of the portion is, or, it is possible that the closer to the substrate 13 a portion of the first portion 178 and the second portion 179 is, the smaller the length D4 and the length D5 of the portion is.

Figure 28:
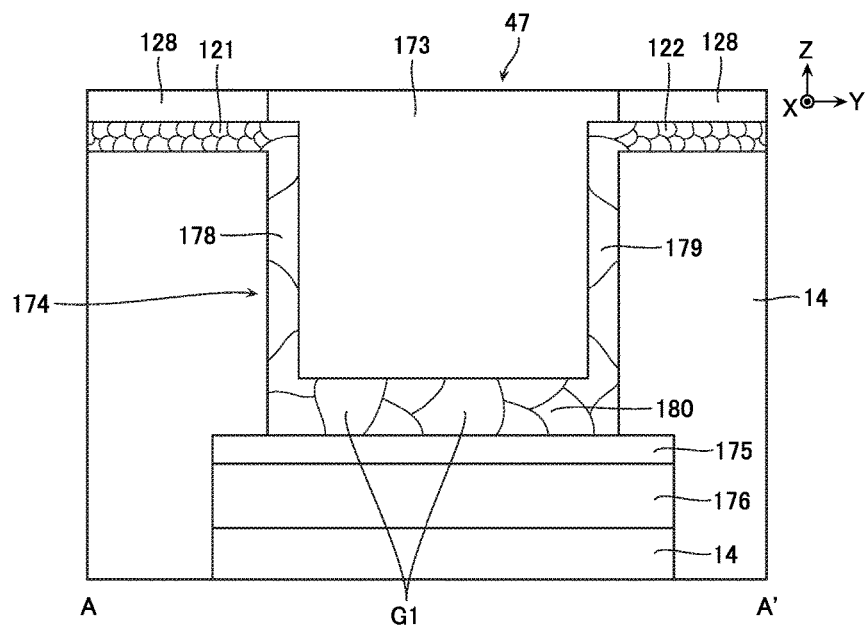
FIG. 28 is a schematic view for explaining about crystal grains in the first semiconductor layer 121, the second semiconductor layer 122, and, a third semiconductor layer 174.

Moreover, as shown in FIG. 28, the third semiconductor layer 174 includes a plurality of the crystal grains G1 larger than the length D6. Moreover, some of these crystal grains contact the insulating layer 173 and the gate insulating film 175. Moreover, an average value of sizes of crystal grains included in the third semiconductor layer 174 is larger than an average value of sizes of crystal grains included in the first semiconductor layer 121 and the second semiconductor layer 122. Moreover, a largest crystal grain included in the third semiconductor layer 174 is larger than a largest crystal grain included in the first semiconductor layer 121 and the second semiconductor layer 122.

Figure 27:
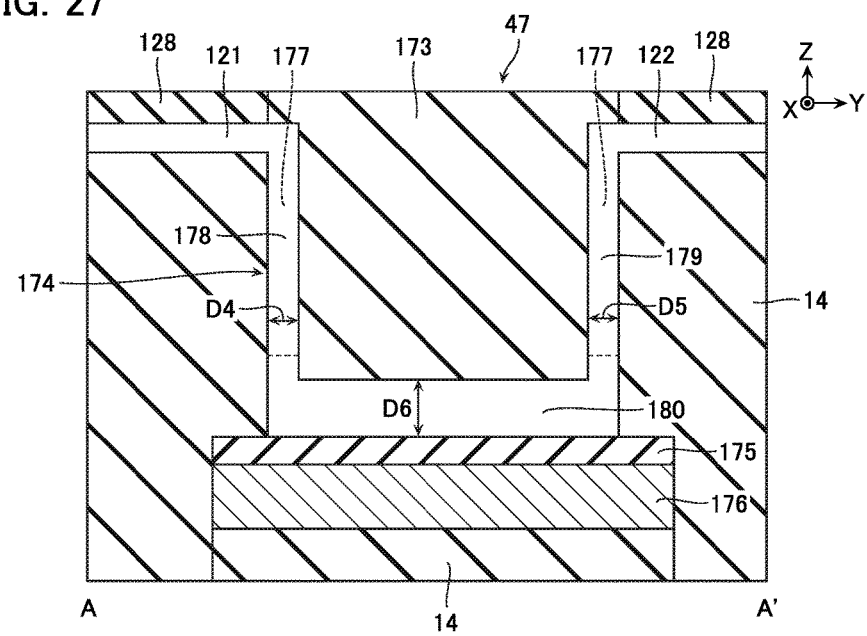
FIG. 27 is a schematic cross-sectional view showing a schematic configuration of same semiconductor memory device.

Moreover, as shown in FIG. 27, the first semiconductor layer 121, the second semiconductor layer 122, and, the third semiconductor layer 174 are provided with an impurity diffusion region 177. The impurity diffusion region 177 is an impurity diffusion region implanted with an n type impurity such as phosphorus (P). The further from the substrate 13 a portion of the impurity diffusion region 177 is, the higher an impurity concentration in the portion is, and, the closer to the substrate 13 a portion of the impurity diffusion region 177 is, the lower an impurity concentration in the portion is. Note that a lower end of the impurity diffusion region 177 may be provided in a vicinity of a lower end of the first portion 178 and the second portion 179, for example. Note that the impurity diffusion region 177 is connected to an unillustrated contact, or the like.

The gate insulating film 175 is provided on the lower surface (on the lower end) of the third semiconductor layer 174. The gate insulating film 175 is configured from the likes of silicon oxide ($SiO_2$) or silicon nitride (SiN), for example. In the illustrated example, the gate insulating film 175 extends in the Y direction, and, has a substantially uniform film thickness. That is, a length in the Z direction of the gate insulating film 175 is substantially uniform. Moreover, in the illustrated example, a length in the Y direction of the gate insulating film 175 is larger than a length in the Y direction of the third semiconductor layer 174.

The gate electrode 176 is provided on a lower surface (on a lower end) of the gate insulating film 175, for example. The gate electrode 176 is configured from the likes of a laminated film of titanium nitride (TiN) and tungsten (W), for example. The gate electrode 176 extends in the Y direction, and, has a substantially uniform film thickness. That is, a length in the Z direction of the gate electrode 176 is substantially uniform.

Moreover, in the illustrated example, a length in the Y direction of the gate electrode 176 is substantially the same as a length in the Y direction of the gate insulating film 175.

[Manufacturing Method]

Next, a manufacturing method of the semiconductor memory device according to the present embodiment will be described with reference to FIGS. 29 to 38.

At a time of manufacturing of the semiconductor memory device, for example, first, the substrate 13, the plurality of conductive layers 101, the semiconductor layer 102, the gate insulating film 103, the insulating layer 14, and so on, described with reference to FIG. 3 are formed by a known method.

Figure 29:
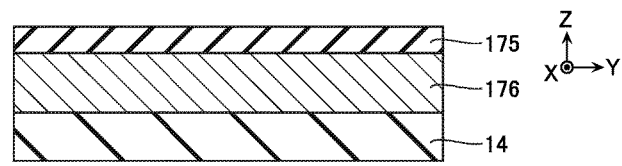
FIG. 29 is a schematic cross-sectional view showing a manufacturing method of the semiconductor memory device according to the eighth embodiment.

Next, as shown in FIG. 29, the gate electrode 176 and the gate insulating film 175 are formed on the upper surface of the insulating layer 14. For example, titanium nitride (TiN), tungsten (W), and, silicon oxide ($SiO_2$) are deposited on the upper surface of the insulating layer 14. Deposition is performed by the likes of CVD, for example. Next, parts of the deposited film are removed. As a result, the film of titanium nitride and tungsten becomes the gate electrode 176, and, the film of silicon oxide becomes the gate insulating film 175. Note that the removal is performed by the likes of RIE, for example.

Figure 30:
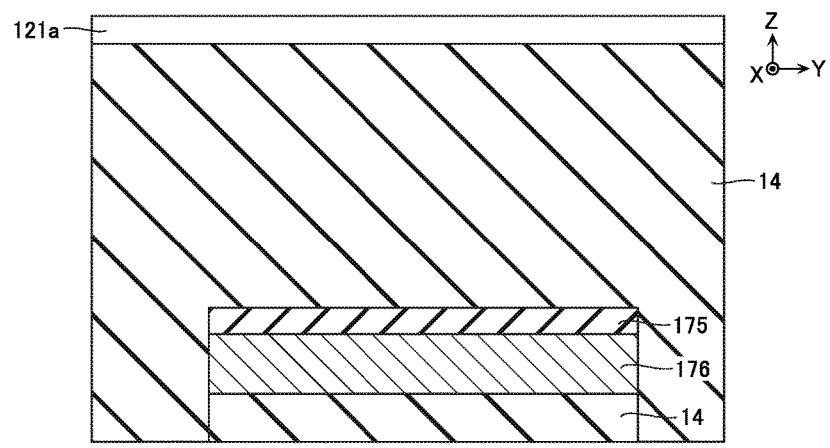
FIG. 30 is a schematic cross-sectional view showing same manufacturing method.

Next, as shown in FIG. 30, the insulating layer 14 and an amorphous silicon layer 121a are formed. For example, the insulating layer 14 covering side surfaces in the Y direction of the insulating layer 14, the gate electrode 176, and, the gate insulating film 175 shown in FIG. 29 and covering an upper surface of the gate insulating film 175 shown in FIG. 29, are deposited. Deposition is performed by the likes of CVD, for example. Next, the upper surface of the deposited insulating layer 14 is planarized. Planarization is performed by the likes of etching back by RIE, for example. Next, the amorphous silicon layer 121a is deposited on the upper surface of the planarized insulating layer 14. Deposition is performed by the likes of CVD, for example.

Figure 31:
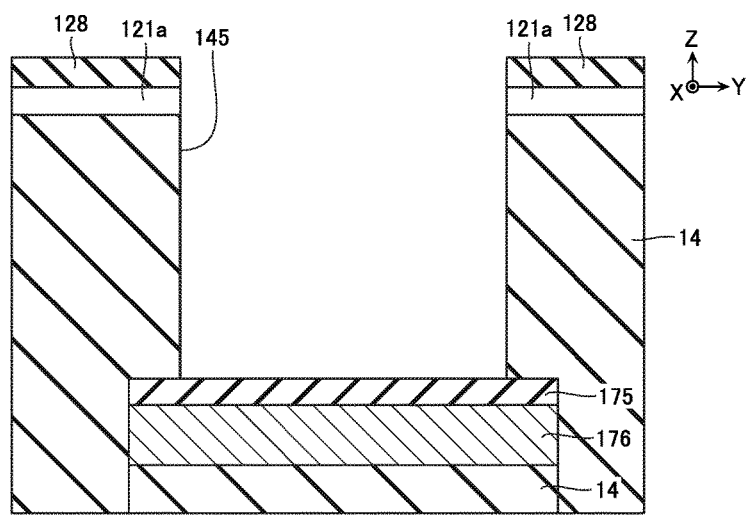
FIG. 31 is a schematic cross-sectional view showing same manufacturing method.

Next, as shown in FIG. 31, the insulating layer 128 configured from the likes of silicon nitride (SiN) is deposited, and, a trench 145 is formed. The trench 145 is a trench extending in the X direction and exposing an upper surface of the gate insulating film 175. Deposition of the insulating layer 128 is performed by the likes of CVD, for example. Formation of the trench 145 is performed by the likes of RIE using the insulating layer 128 as a mask and the gate insulating film 175 as a stopper, for example.

Figure 32:
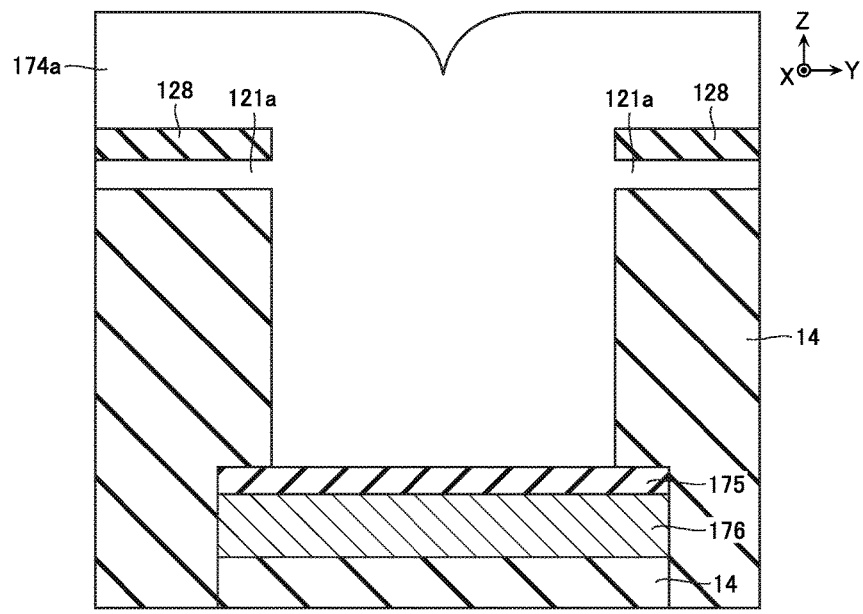
FIG. 32 is a schematic cross-sectional view showing same manufacturing method.

Next, as shown in FIG. 32, an amorphous silicon layer 174a is deposited in the trench 145. This step is performed similarly to the step described with reference to FIG. 11, for example.

Figure 33:
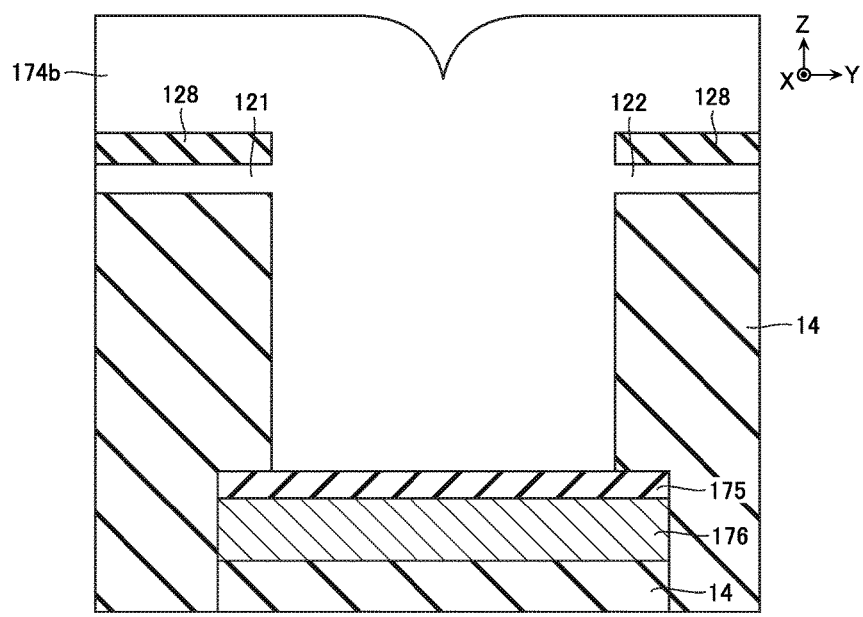
FIG. 33 is a schematic cross-sectional view showing same manufacturing method.

Next, as shown in FIG. 33, the first semiconductor layer 121, the second semiconductor layer 122, and, a polycrystalline silicon layer 174b are formed. This step is performed similarly to the step described with reference to FIG. 12, for example.

Figure 34:
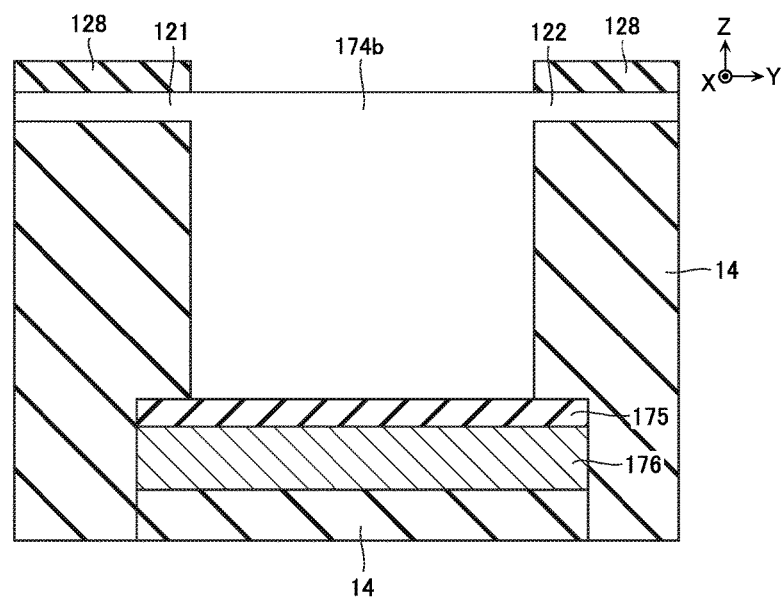
FIG. 34 is a schematic cross-sectional view showing same manufacturing method.

Next, as shown in FIG. 34, part of the polycrystalline silicon layer 174b is removed. This step is performed similarly to the step described with reference to FIG. 13, for example.

Figure 35:
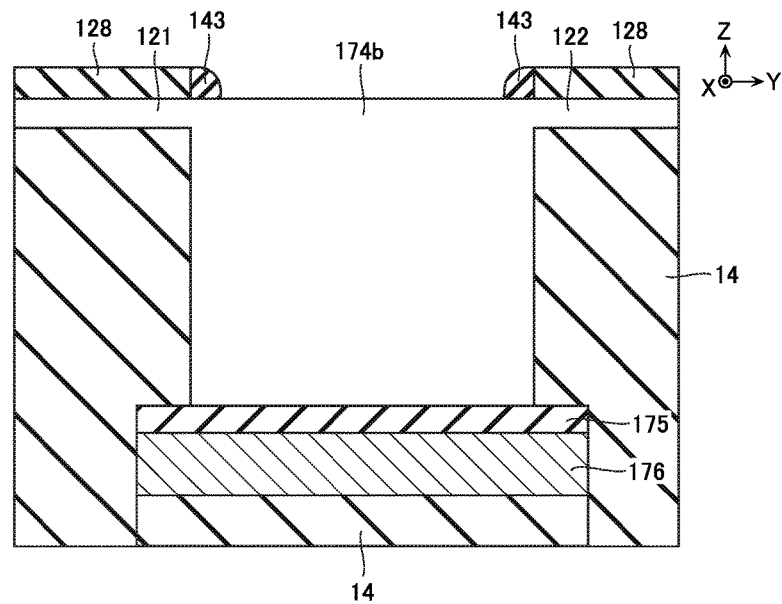
FIG. 35 is a schematic cross-sectional view showing same manufacturing method.

Next, as shown in FIG. 35, a carbon mask 143 is formed. This step is performed similarly to the steps described with reference to FIGS. 14 to 16, for example.

Figure 36:
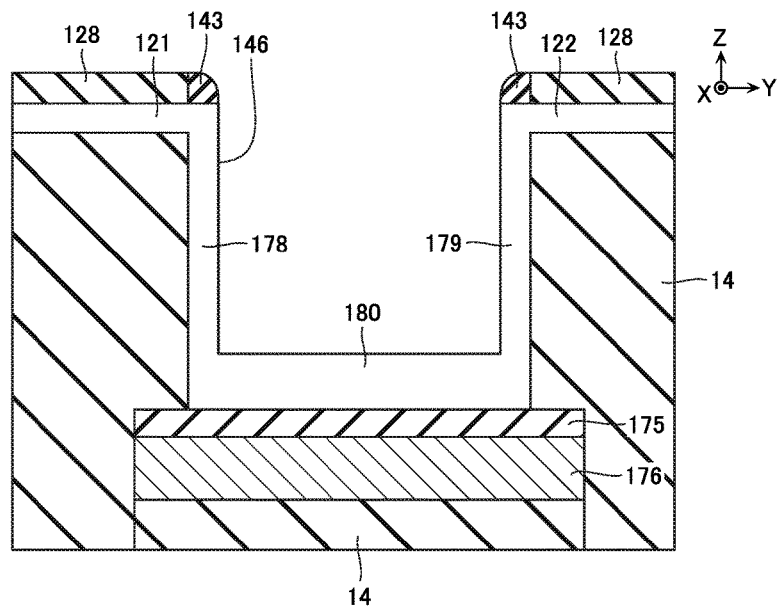
FIG. 36 is a schematic cross-sectional view showing same manufacturing method.

Next, as shown in FIG. 36, a trench 146 is formed in an upper surface of the polycrystalline silicon layer 174b. This step is performed similarly to the step described with reference to FIG. 17, for example.

Figure 37:
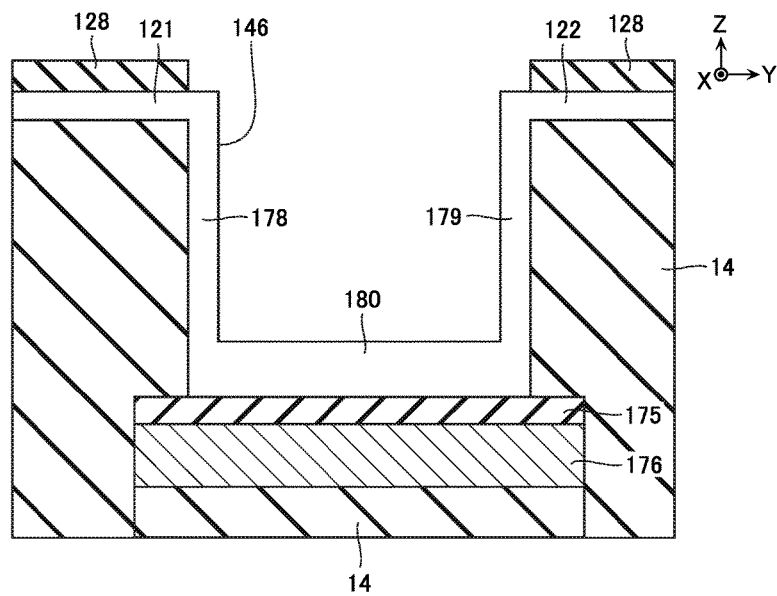
FIG. 37 is a schematic cross-sectional view showing same manufacturing method.

Next, as shown in FIG. 37, the carbon mask 143 is removed. This step is performed similarly to the step described with reference to FIG. 18, for example.

Figure 38:
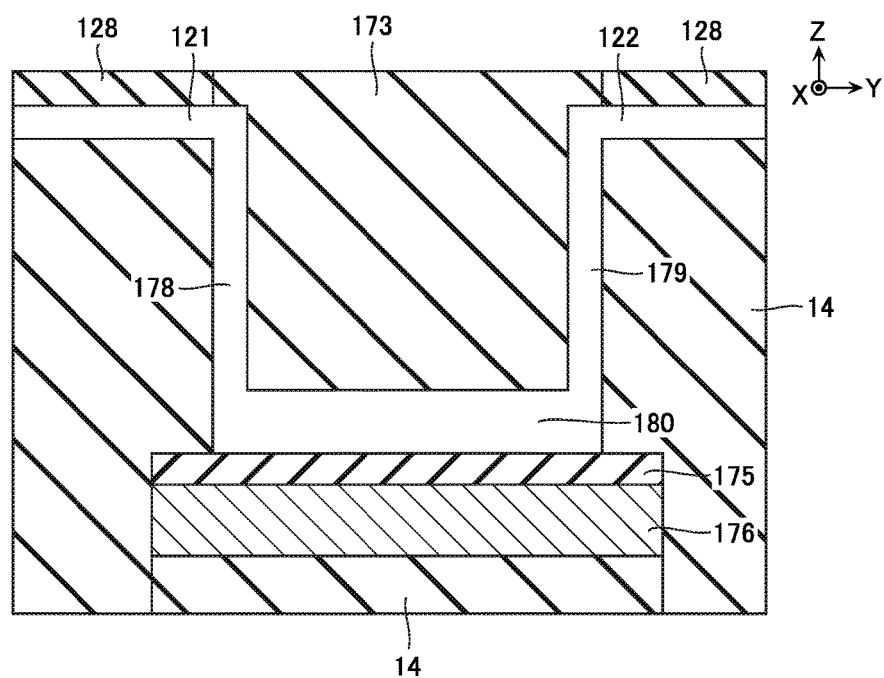
FIG. 38 is a schematic cross-sectional view showing same manufacturing method.

Next, as shown in FIG. 38, the insulating layer 173 is formed. For example, an insulating layer of the likes of $SiO_2$ is deposited in the trench 146, and, the trench 146 is filled in by the insulating layer. Deposition is performed by the likes of CVD, for example. Next, the likes of CMP using the insulating layer 128 as a stopper is performed, and, part of the deposited insulating layer is removed, whereby the insulating layer 173 is formed.

Next, the impurity diffusion region 177 is formed by the likes of ion implantation, whereby a structure shown in FIG. 27 is formed. Moreover, this structure is divided in the X direction by the likes of RIE to form the insulating layer 109, whereby a structure shown in FIG. 26 is formed. Then, various kinds of wirings or contacts, and so on, are formed, whereby a structure according to the present embodiment is formed.

Other Embodiments

In the above-described embodiments, a semiconductor memory device utilizing a so-called flash memory was exemplified as the semiconductor memory device. However, as mentioned above, semiconductor memory devices having memory cells disposed three-dimensionally therein have a variety of structures, and, there is also known a structure including a stepped contact section by which a wiring connected to the memory cell is connected to a contact. The present invention may be applied to a semiconductor memory device including such a contact section.

Moreover, the transistors 15, and so on, may be provided in both of the second region R2 and the third region R3 (FIG. 2). In contrast, the transistors 15, and so on, may be provided in only one of the second region R2 and the third region R3, or, may be provided in another region.

[Others]

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A semiconductor memory device, comprising:
a substrate;
a memory cell array, the memory cell array comprising a plurality of memory cells arranged in a first direction intersecting a surface of the substrate;
an insulating layer covering at least part of the memory cell array; and
a transistor provided on the insulating layer,
the transistor comprising:
a first semiconductor layer and a second semiconductor layer provided on the insulating layer and separated from each other in a second direction intersecting the first direction;
a gate electrode provided between the first semiconductor layer and the second semiconductor layer in the second direction, the gate electrode extending in the first direction, and, one end in the first direction of the gate electrode being closer to the substrate than the first semiconductor layer and the second semiconductor layer;
a gate insulating film provided on the one end and on side surfaces in the second direction of the gate electrode; and
a third semiconductor layer facing the one end and the side surfaces in the second direction of the gate electrode via the gate insulating film, the third semiconductor layer being connected to the first semiconductor layer and the second semiconductor layer, and
the third semiconductor layer including a crystal grain larger than a shortest distance between the insulating layer and the gate insulating film.

2. The semiconductor memory device according to claim 1, wherein
the crystal grain contacts the insulating layer and the gate insulating film.

3. The semiconductor memory device according to claim 1, wherein
an average value of size of the crystal grain included in the third semiconductor layer is larger than an average value of size of the crystal grain included in the first semiconductor layer and the second semiconductor layer.

4. The semiconductor memory device according to claim 1, wherein
a largest crystal grain included in the third semiconductor layer is larger than a largest crystal grain included in the first semiconductor layer and the second semiconductor layer.

5. The semiconductor memory device according to claim 1, wherein
the third semiconductor layer comprises:
a first portion connected to the first semiconductor layer and extending in the first direction;
a second portion connected to the second semiconductor layer and extending in the first direction; and
a third portion connected to the first portion and the second portion, the third portion being closer to the substrate than the first semiconductor layer and the second semiconductor layer.

6. The semiconductor memory device according to claim 5, wherein lengths in the second direction of the first portion and the second portion are smaller than a length in the first direction of the third portion.

7. The semiconductor memory device according to claim 5, wherein
the closer to the substrate a portion of the first portion and the second portion is, the larger length in the second direction the portion has.

8. The semiconductor memory device according to claim 5, wherein
the closer to the substrate a portion of the first portion and the second portion is, the smaller length in the second direction the portion has.

9. The semiconductor memory device according to claim 5, wherein
a length in the second direction of the first portion is larger than length in the second direction of the second portion.

10. The semiconductor memory device according to claim 1, wherein
the transistor comprises:
a fourth semiconductor layer provided on the insulating layer and separated in the second direction from the first semiconductor layer;
a first insulating film provided between the first semiconductor layer and the fourth semiconductor layer and extending in the first direction, one end in the first direction of the first insulating film being closer to the substrate than the first semiconductor layer and the fourth semiconductor layer; and
a fifth semiconductor layer provided on the one end and on side surfaces in the second direction of the first insulating film, the fifth semiconductor layer being connected to the first semiconductor layer and the fourth semiconductor layer, and
the fifth semiconductor layer includes a crystal grain larger than a shortest distance between the insulating layer and the first insulating film.

11. The semiconductor memory device according to claim 1, wherein
the other end in the first direction of the gate electrode is closer to the substrate than the first semiconductor layer and the second semiconductor layer.

12. The semiconductor memory device according to claim 1, wherein
the substrate comprises:
a first region where the memory cell is provided;
a second region where an end section in a third direction intersecting a plane including the first direction and the second direction, of the memory cell array is provided; and
a third region where an end section in the second direction of the memory cell array is provided, and
the transistor is provided in at least one of the second region and the third region.

13. The semiconductor memory device according to claim 1, further comprising
an operation voltage generating circuit configured to generate an operation voltage and to output the operation voltage from an output terminal, wherein
at least one of the first semiconductor layer and the second semiconductor layer is electrically connected to the output terminal of the operation voltage generating circuit.

14. A semiconductor memory device, comprising:
a substrate;
a memory cell array, the memory cell array comprising a plurality of memory cells arranged in a first direction intersecting a surface of the substrate;
a first insulating layer covering at least part of the memory cell array; and
a transistor provided on the first insulating layer,
the transistor comprising:
a first semiconductor layer and a second semiconductor layer provided on the first insulating layer and separated from each other in a second direction intersecting the first direction;
a second insulating layer provided between the first semiconductor layer and the second semiconductor layer in the second direction, one end in the first direction of the second insulating layer being closer to the substrate than the first semiconductor layer and the second semiconductor layer;
a third semiconductor layer provided on the one end and on side surfaces in the second direction of the second insulating layer, the third semiconductor layer being connected to the first semiconductor layer and the second semiconductor layer;
a gate electrode provided between the third semiconductor layer and the substrate, the gate electrode facing the third semiconductor layer; and
a gate insulating film provided between the third semiconductor layer and the gate electrode,
the third semiconductor layer including a crystal grain larger than a shortest distance between the second insulating layer and the gate insulating film.

15. The semiconductor memory device according to claim 14, wherein
the crystal grain contacts the second insulating layer and the gate insulating film.

16. The semiconductor memory device according to claim 14, wherein
an average value of size of the crystal grain included in the third semiconductor layer is larger than an average value of size of the crystal grain included in the first semiconductor layer and the second semiconductor layer.

17. The semiconductor memory device according to claim 14, wherein
the third semiconductor layer comprises:
a first portion connected to the first semiconductor layer and extending in the first direction;
a second portion connected to the second semiconductor layer and extending in the first direction; and
a third portion connected to the first portion and the second portion, the third portion being closer to the substrate than the first semiconductor layer and the second semiconductor layer.

18. The semiconductor memory device according to claim 17, wherein
lengths in the second direction of the first portion and the second portion are smaller than a length in the first direction of the third portion.

19. The semiconductor memory device according to claim 14, wherein
the substrate comprises:
a first region where the memory cell is provided;
a second region where an end section in a third direction intersecting a plane including the first direction and the second direction, of the memory cell array is provided; and
a third region where an end section in the second direction of the memory cell array is provided, and the transistor is provided in at least one of the second region and the third region.

20. The semiconductor memory device according to claim 14, further comprising an operation voltage generating circuit configured to generate an operation voltage and to output the operation voltage from an output terminal, wherein at least one of the first semiconductor layer and the second semiconductor layer is electrically connected to the output terminal of the operation voltage generating circuit.

\* \* \* \* \*